United States Patent
Ely et al.

(10) Patent No.: US 9,769,920 B2
(45) Date of Patent: Sep. 19, 2017

(54) FLEXIBLE PRINTED CIRCUITS WITH BEND RETENTION STRUCTURES

(71) Applicant: Apple Inc., Cupertino, CA (US)

(72) Inventors: Colin M. Ely, Cupertino, CA (US); Anna-Katrina Shedletsky, Sunnyvale, CA (US); Fletcher R. Rothkopf, Los Altos, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 383 days.

(21) Appl. No.: 14/226,593

(22) Filed: Mar. 26, 2014

(65) Prior Publication Data
US 2015/0282304 A1 Oct. 1, 2015

(51) Int. Cl.
*H05K 1/02* (2006.01)
*H05K 1/03* (2006.01)
(Continued)

(52) U.S. Cl.
CPC .......... *H05K 1/0281* (2013.01); *H05K 1/028* (2013.01); *H05K 3/28* (2013.01); *H05K 1/0284* (2013.01); *H05K 1/0326* (2013.01); *H05K 1/0346* (2013.01); *H05K 1/115* (2013.01); *H05K 3/0061* (2013.01); *H05K 2201/0129* (2013.01); *H05K 2201/0154* (2013.01); *H05K 2201/0187* (2013.01); *H05K 2201/0305* (2013.01); *H05K 2201/055* (2013.01); *H05K 2201/057* (2013.01); *H05K 2201/0999* (2013.01); *H05K 2201/09109* (2013.01); *H05K 2201/09872* (2013.01); *H05K 2201/10128* (2013.01);
(Continued)

(58) Field of Classification Search
CPC ...... H05K 1/189; H05K 3/281; H05K 1/0281; H05K 1/0326; H05K 1/0346; H05K 1/115; H05K 2201/0154; H05K 2201/057; H01L 2924/01079; G21C 3/334; G21Y 2002/201; G21Y 2002/302; G21Y 2002/303; G21Y 2004/30; G21Y 2004/40; Y02E 30/40
USPC .................. 361/749–750; 174/250, 255–256
See application file for complete search history.

(56) References Cited

U.S. PATENT DOCUMENTS

| | | | |
|---|---|---|---|
| 4,666,821 A * | 5/1987 | Hein .................... | C08F 299/065 427/510 |
| 5,179,501 A * | 1/1993 | Ocken .................. | H05K 1/0278 174/254 |

(Continued)

*Primary Examiner* — Nathan Milakovich
(74) *Attorney, Agent, or Firm* — Treyz Law Group, P.C.; G. Victor Treyz; David K. Cole

(57) ABSTRACT

An electronic device may be provided with printed circuits. Electrical components may be interconnected using signal paths formed from metal traces in the printed circuits. The printed circuits may include flexible printed circuits with bent configurations. The flexible printed circuits may be provided with integral bend retention structures. A bend retention structure may be formed from a polymer layer, a solder layer, a stiffener formed from metal or polymer that is attached to flexible printed circuit layers with adhesive, a conformal plastic coating that covers exposed metal traces at a bend, a metal stiffener with screw holes, a shape memory alloy, a portion of a flexible printed circuit dielectric substrate layer with a reduced elongation at yield value, or combinations of these structures. The bend retention structure maintains a bend in a bent flexible printed circuit.

3 Claims, 24 Drawing Sheets

(51) Int. Cl.
  *H05K 1/11* (2006.01)
  *H05K 3/28* (2006.01)
  *H05K 3/00* (2006.01)

(52) U.S. Cl.
  CPC .............. *H05K 2201/10409* (2013.01); *H05K 2201/2009* (2013.01); *H05K 2203/013* (2013.01); *H05K 2203/0126* (2013.01); *H05K 2203/1194* (2013.01); *H05K 2203/1327* (2013.01); *H05K 2203/1366* (2013.01)

(56) References Cited

U.S. PATENT DOCUMENTS

| | | | |
|---|---|---|---|
| 5,434,362 A * | 7/1995 | Klosowiak | H05K 1/028 174/254 |
| 5,516,989 A * | 5/1996 | Uedo | H05K 1/028 174/250 |
| 6,236,531 B1 | 5/2001 | Allsup et al. | |
| 6,292,370 B1 * | 9/2001 | Anderson | H05K 1/0393 174/254 |
| 6,483,037 B1 * | 11/2002 | Moore | H05K 1/0278 174/254 |
| 6,501,661 B1 * | 12/2002 | Moore | H05K 1/0278 361/736 |
| 7,095,622 B2 * | 8/2006 | Barsun | H05K 7/1439 361/788 |
| 7,116,522 B2 * | 10/2006 | Poorman | H05K 1/028 360/241 |
| 7,629,537 B2 | 12/2009 | Ice | |
| 7,643,305 B2 | 1/2010 | Lin | |
| 7,719,098 B2 | 5/2010 | Wehrly, Jr. | |
| 7,902,474 B2 | 3/2011 | Mittleman et al. | |
| 8,294,031 B2 * | 10/2012 | Bagung | H05K 1/0278 174/254 |
| 9,019,710 B2 * | 4/2015 | Jeziorek | H05K 3/0061 174/254 |
| 9,190,720 B2 * | 11/2015 | Shedletsky | H01Q 1/38 |
| 9,462,686 B2 * | 10/2016 | Na | H05K 1/028 |
| 2002/0189854 A1 * | 12/2002 | Crumly | H05K 1/0281 174/254 |
| 2005/0161776 A1 * | 7/2005 | Naitoh | H01L 23/4985 257/666 |
| 2012/0044637 A1 * | 2/2012 | Rothkopf | G06F 1/1626 361/679.55 |
| 2012/0050958 A1 * | 3/2012 | Sanford | G06F 1/1626 361/679.01 |
| 2012/0113606 A1 * | 5/2012 | Preuschl | H05K 1/0278 361/752 |
| 2013/0048347 A1 * | 2/2013 | Shiu | H05K 1/028 174/254 |
| 2013/0081756 A1 * | 4/2013 | Franklin | B29C 53/04 156/221 |
| 2013/0148315 A1 * | 6/2013 | Dabov | G06F 1/1613 361/749 |
| 2013/0156442 A1 | 6/2013 | Mu | |
| 2013/0215579 A1 * | 8/2013 | Sutardja | H01L 21/4846 361/749 |
| 2013/0242600 A1 | 9/2013 | Franklin et al. | |
| 2014/0065326 A1 * | 3/2014 | Lee | G06F 1/16 428/12 |
| 2015/0305136 A1 * | 10/2015 | Tachikawa | H05K 1/0281 174/254 |

* cited by examiner

FLEXIBLE PRINTED CIRCUITS WITH BEND RETENTION STRUCTURES

BACKGROUND

This relates generally to printed circuits and, more particularly, to printed circuit structures with bends for use in electronic devices.

Electronic devices often include printed circuits. Flexible printed circuits can serve as substrates for electrical components and other devices and may be used to create signal cables that interconnect circuitry in an electronic device.

Flexible printed circuits are formed from patterned metal traces supported by layers of dielectric substrate material such as sheets of polyimide. It can be challenging to form bends in flexible printed circuits, because polyimide resists bending and has a springiness that attempts to restore a bent flexible printed circuit to its original unbent state. The restoring forces generated by a bent flexible printed circuit can create assembly difficulties and can impact reliability.

It would therefore be desirable to be able to provide improved arrangements for providing flexible printed circuits with bends for use in an electronic device.

SUMMARY

An electronic device may be provided with printed circuits. Electrical components may be interconnected using signal paths formed from metal traces in the printed circuits. The printed circuits may include flexible printed circuits with bent configurations. A bent flexible printed circuit may be coupled between a printed circuit board and a device component such as a display or other electrical device or may be coupled between other circuitry.

A flexible printed circuit may be provided with an integral bend retention structure. A bend retention structure may be formed from a polymer layer, a solder layer, a stiffener formed from metal or plastic that is attached to flexible printed circuit layers with adhesive, a conformal plastic coating that covers exposed bent metal traces at the bend in the flexible printed circuit, a metal stiffener with screw holes, a planar shape memory alloy structure that has been returned to a bent configuration by heating the shape memory alloy after attaching the shape memory alloy to flexible printed circuit layers in the flexible printed circuit, a localized portion of a flexible printed circuit dielectric substrate layer with a reduced elongation at yield value, or combinations of these structures. The bend retention structure maintains a bend in the flexible printed circuit or at least reduces the restoring force generated by bending the dielectric substrate layer in the flexible printed circuit.

DETAILED DESCRIPTION

Electronic devices may be provided with printed circuits. The printed circuits may include rigid printed circuit boards (e.g., printed circuits formed from rigid printed circuit board material such as fiberglass-filled epoxy) and flexible printed circuits (e.g., printed circuits that include one or more sheets of polyimide substrate material or other flexible polymer layers). The flexible printed circuits may be provided with bends. The bends may be used to route the flexible printed circuits between different areas of interest in an electronic device. Illustrative electronic devices that may be provided with flexible printed circuits are shown in FIGS. 1, 2, 3, and 4.

Figure 1:
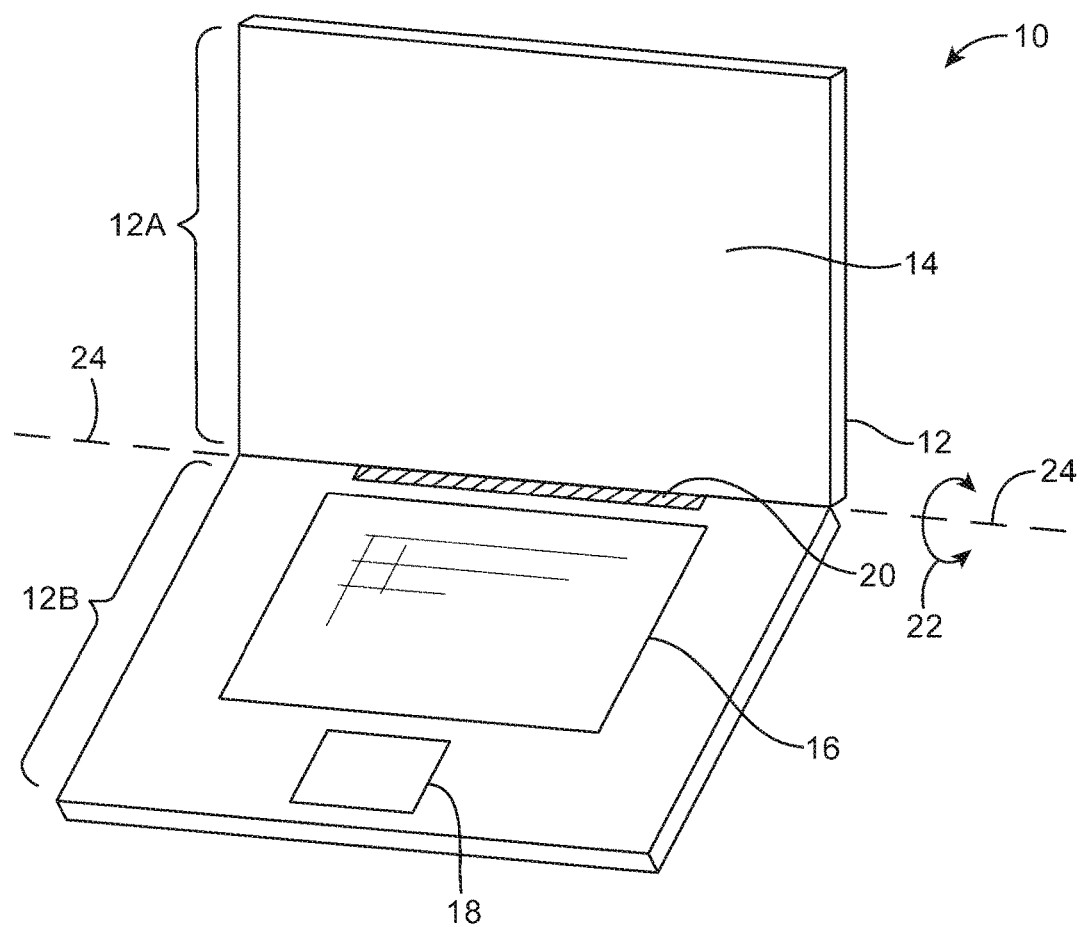
FIG. 1 is a perspective view of an illustrative electronic device such as a laptop computer in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes referred to as a display housing or lid, is placed in a closed position by rotating upper housing 12A towards lower housing 12B about rotational axis 24.

Figure 2:
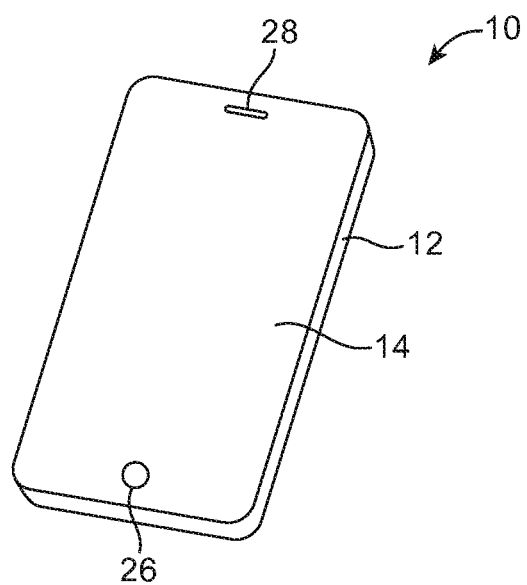
FIG. 2 is a perspective view of an illustrative electronic device such as a handheld electronic device in accordance with an embodiment.

FIG. 2 shows an illustrative configuration for electronic device 10 based on a handheld device such as a cellular telephone, music player, gaming device, navigation unit, or other compact device. In this type of configuration for device 10, device 10 has opposing front and rear surfaces. The rear surface of device 10 may be formed from a planar portion of housing 12. Display 14 forms the front surface of device 10. Display 14 may have an outermost layer that includes openings for components such as button 26 and speaker port 28.

Figure 3:
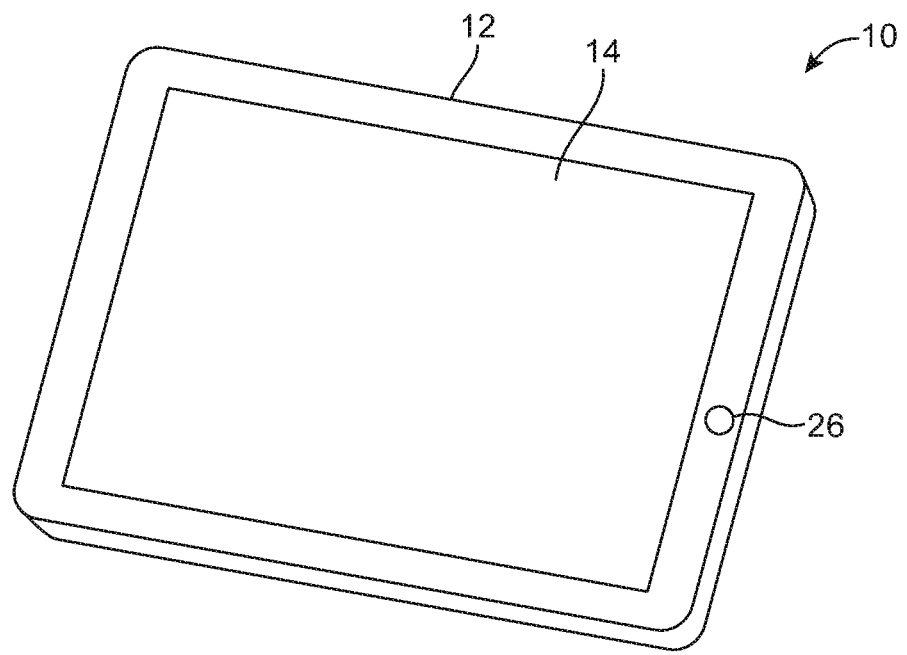
FIG. 3 is a perspective view of an illustrative electronic device such as a tablet computer in accordance with an embodiment.

In the example of FIG. 3, electronic device 10 is a tablet computer. In electronic device 10 of FIG. 3, device 10 has opposing planar front and rear surfaces. The rear surface of device 10 is formed from a planar rear wall portion of housing 12. Curved or planar sidewalls may run around the periphery of the planar rear wall and may extend vertically upwards. Display 14 is mounted on the front surface of device 10 in housing 12. As shown in FIG. 3, display 14 has an outermost layer with an opening to accommodate button 26.

Figure 4:
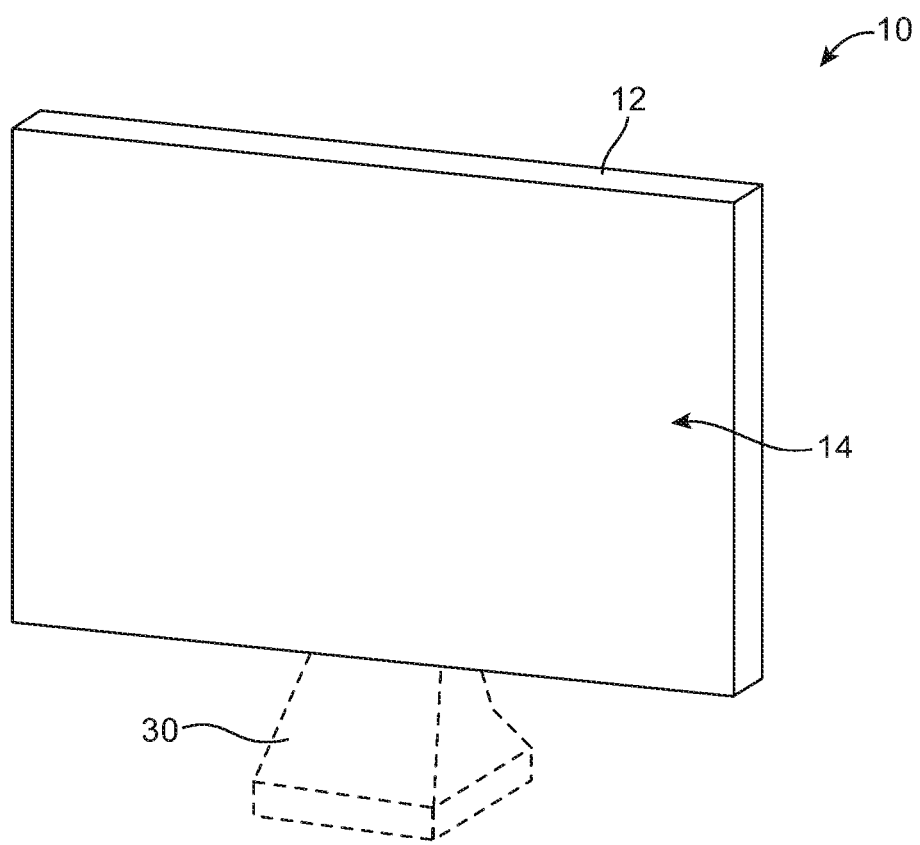
FIG. 4 is a perspective view of an illustrative electronic device such as a computer or other equipment with a display in accordance with an embodiment.

FIG. 4 shows an illustrative configuration for electronic device 10 in which device 10 is a computer display, a computer that has an integrated computer display, or a television. Display 14 is mounted on a front face of device 10 in housing 12. With this type of arrangement, housing 12 for device 10 may be mounted on a wall or may have an optional structure such as support stand 30 to support device 10 on a flat surface such as a table top or desk.

An electronic device such as electronic device 10 of FIGS. 1, 2, 3, and 4, may, in general, be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. The examples of FIGS. 1, 2, 3, and 4 are merely illustrative.

Device 10 may include a display such as display 14. Display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button, an opening may be formed in the display cover layer to accommodate a speaker port, etc.

Figure 5:
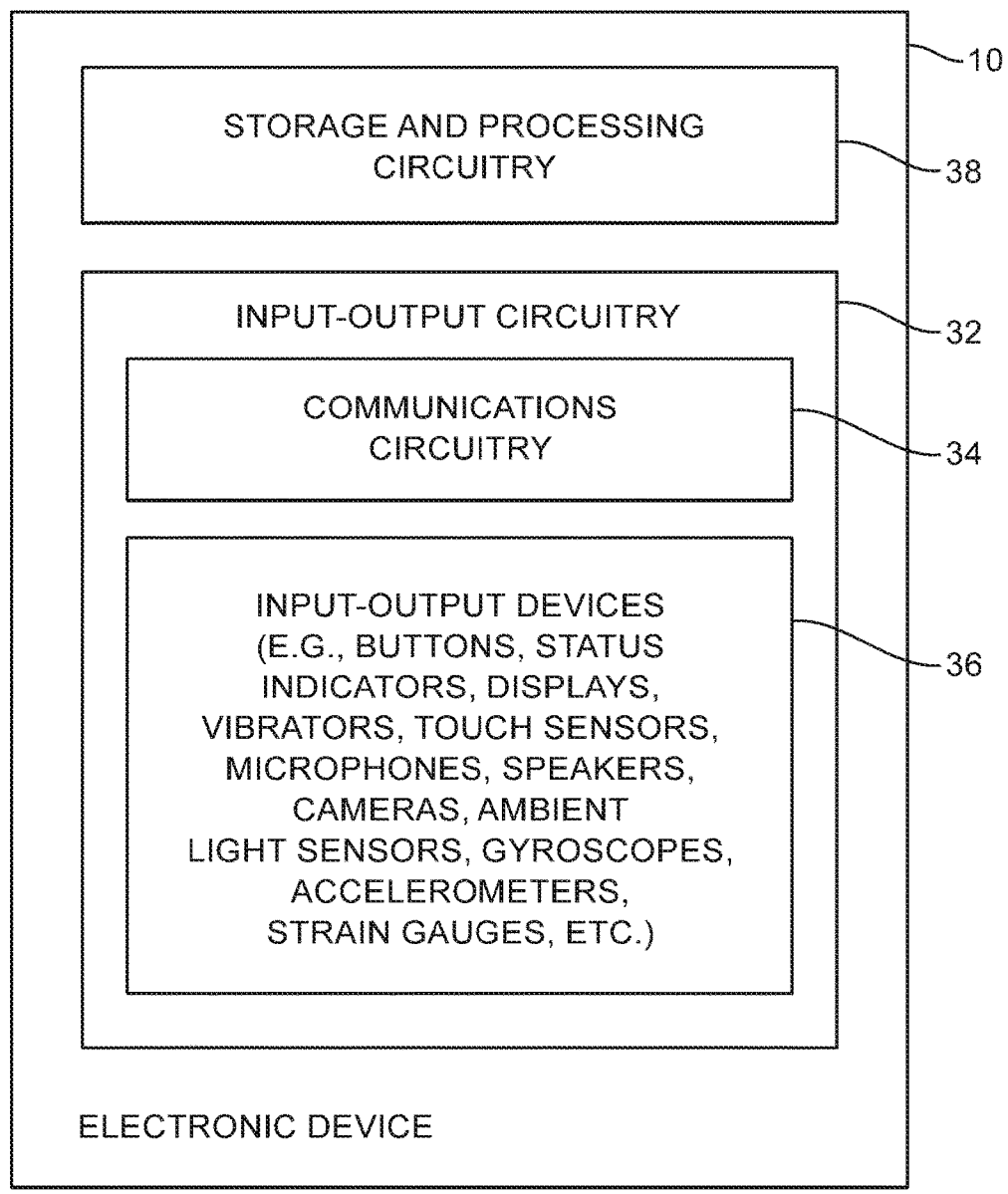
FIG. 5 is a schematic diagram of illustrative circuitry in an electronic device in accordance with an embodiment.

A schematic diagram of an illustrative device such as devices 10 of FIGS. 1, 2, 3, and 4 is shown in FIG. 5. As shown in FIG. 5, electronic device 10 may include control circuitry such as storage and processing circuitry 38. Storage and processing circuitry 38 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 38 may be used in controlling the operation of device 10. The processing circuitry may be based on a processor such as a microprocessor and other suitable integrated circuits. With one suitable arrangement, storage and processing circuitry 38 may be used to run software on device 10, such as internet browsing applications, email applications, media playback applications, operating system functions, software for capturing and processing images, software implementing functions associated with gathering and processing sensor data such as stress data, etc.

Input-output circuitry 32 may be used to allow data to be supplied to device 10 and to allow data to be provided from device 10 to external devices. Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36. Input-output devices 36 may include devices such as buttons (see, e.g., button 26 of FIGS. 2 and 3), joysticks, click wheels, scrolling wheels, a touch screen (see, e.g., display 14), other touch sensors such as track pads (see, e.g., track pad 18 of FIG. 1), touch-sensor-based buttons, vibrators, audio components such as microphones and speakers, image capture devices such as a camera module having an image sensor and a corresponding lens system, keyboards, status-indicator lights, tone generators, key pads, strain gauges (e.g., a button based on a strain gauge), proximity sensors, ambient light sensors, capacitive proximity sensors, light-based proximity sensors, gyroscopes, accelerometers, magnetic sensors, temperature sensors, fingerprint sensors, and other equipment for gathering input from a user or other external source and/or generating output for a user.

Figure 6:
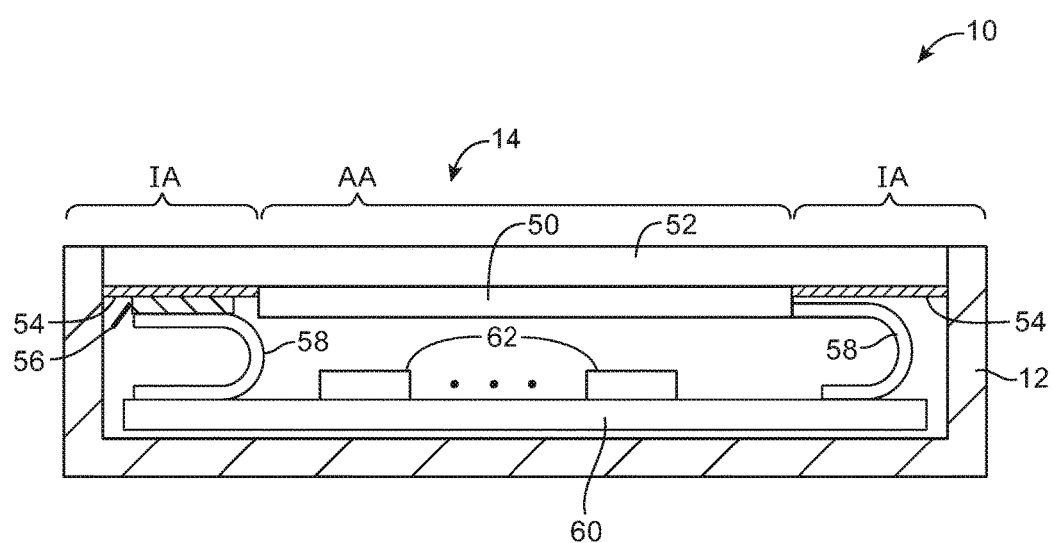
FIG. 6 is a cross-sectional side view of an illustrative electronic device in accordance with an embodiment.

A cross-sectional side view of an illustrative electronic device of the type that may be provided with one or more flexible printed circuits is shown in FIG. 6. As shown in the illustrative configuration of FIG. 6, device 10 may have a display such as display 14 that is mounted on the front face of device 10. Display 14 may have a display cover layer such as cover layer 52 and a display module such as display module 50. Display cover layer 52 may be formed from a glass or plastic layer. Display module 50 may be, for example, a liquid crystal display module or an organic light-emitting diode display layer (as examples). Display module 50 may have a rectangular outline when viewed from the front of device 10 and may be mounted in a central rectangular active area AA on the front of device 10. An inactive area IA that forms a border for display 14 may surround active area AA. Opaque masking material such as black ink 54 may be used to coat the underside of cover layer 52 in inactive area IA.

Device 10 may include components such as components 62 that are mounted on one or more printed circuit boards such as printed circuit board 60. Printed circuit board 60 may have one or more layers of dielectric material and one or more layers of metal traces. Printed circuit board 60 of FIG. 6 may be a rigid printed circuit board or a flexible printed circuit board. Components 62 may be, for example, integrated circuits, discrete components such as capacitors, resistors, and inductors, switches, connectors, sensors, input-output devices such as status indicators lights, audio components, or other electrical and/or mechanical components for device 10. Components 62 may be attached to printed circuit 54 using solder, welds, anisotropic conductive film or other conductive adhesives, or other conductive connections. One or more layers of patterned metal interconnects (i.e., copper traces or metal traces formed from other materials) may be formed within one or more dielectric layers in printed circuit board 60 to form signal lines that route signals between components 62.

If desired, device 10 may have components mounted on the underside of display cover layer 52 such as illustrative component 56 on opaque masking layer 54 in inactive area IA of device 10 of FIG. 6. Component 56 may be a touch sensor, a fingerprint sensor, a strain gauge sensor, a button, or other input-output device 36 (as examples).

Flexible printed circuits 58 may have layers of dielectric and layers of metal traces. The metal traces of flexible printed circuits 58 may be used to form signal paths to interconnect the circuitry of device 10. For example, flexible printed circuits 58 may have signal paths that interconnect component 56 to the circuitry of components 62 on printed circuit 60, signal path that couple display module 50 to components 62 on printed circuit 60, or signal paths for interconnecting other components in device 10.

Flexible printed circuits such as illustrative flexible printed circuits 58 of FIG. 6 are often bent. The ability to bend flexible printed circuits in device 10 helps a device designer to route signals in tight spaces and in portions of a device where a planar printed circuit would be ineffective or cumbersome.

Figure 7:
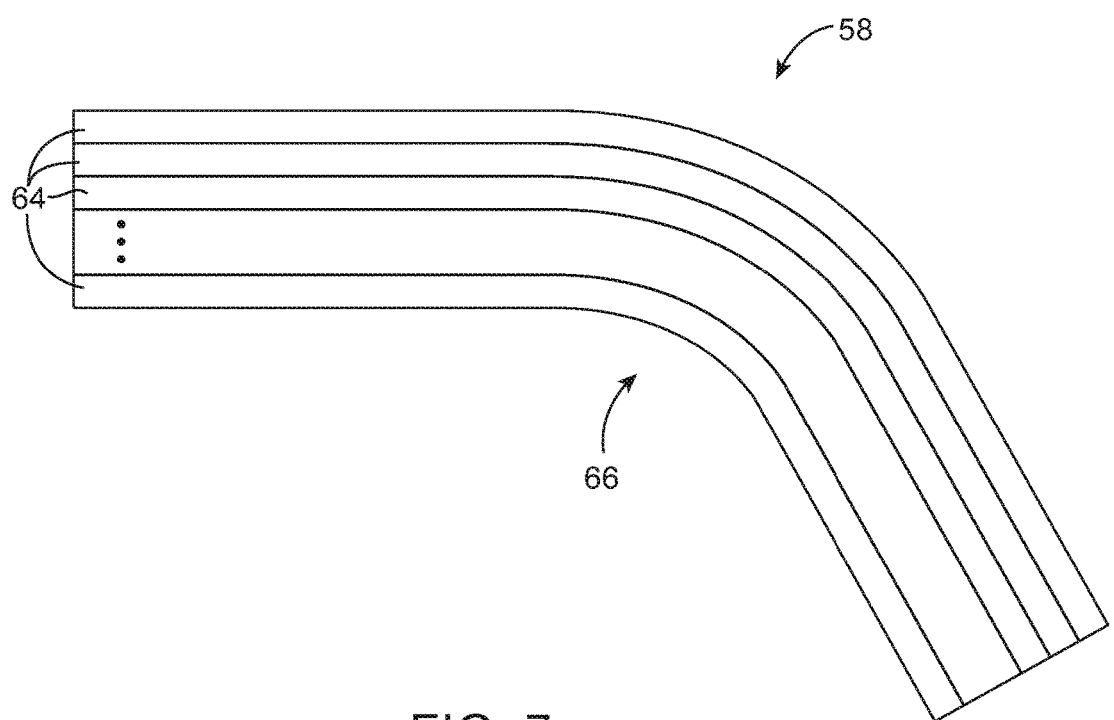
FIG. 7 is a cross-sectional side view of a flexible printed circuit with a bend in accordance with an embodiment.

A cross-sectional side view of an illustrative flexible printed circuit is shown in FIG. 7. As shown in FIG. 7, flexible printed circuit 58 may have a bend such as bend 66. Flexible printed circuit 58 may include multiple layers of material such as layers 64. Layers 64 may include one or more metal layers, one or more dielectric layers, and one or more adhesive layers (or no adhesive layers). Metal traces formed from the metal layers may be used to carry electrical signals. Examples of metals that may be used in the metal layers of layers 64 in flexible printed circuit 58 include copper, nickel, gold, and aluminum. Examples of dielectric materials that may be used in forming the dielectric layers of layers 64 in flexible printed circuit 58 include polyimide, acrylic, and other polymers. Examples of adhesives that may be used in forming the adhesive layers of layers 64 in flexible printed circuit 58 include acrylic adhesives and epoxy adhesives. Other types of metal, dielectric, and adhesive may be used in forming layers 60 if desired. These are merely illustrative examples. Moreover, additional structures may be added to the dielectric, metal, and adhesive layers of flexible printed circuit 58 to help hold flexible printed circuit 58 in a bent configuration.

Figure 8:
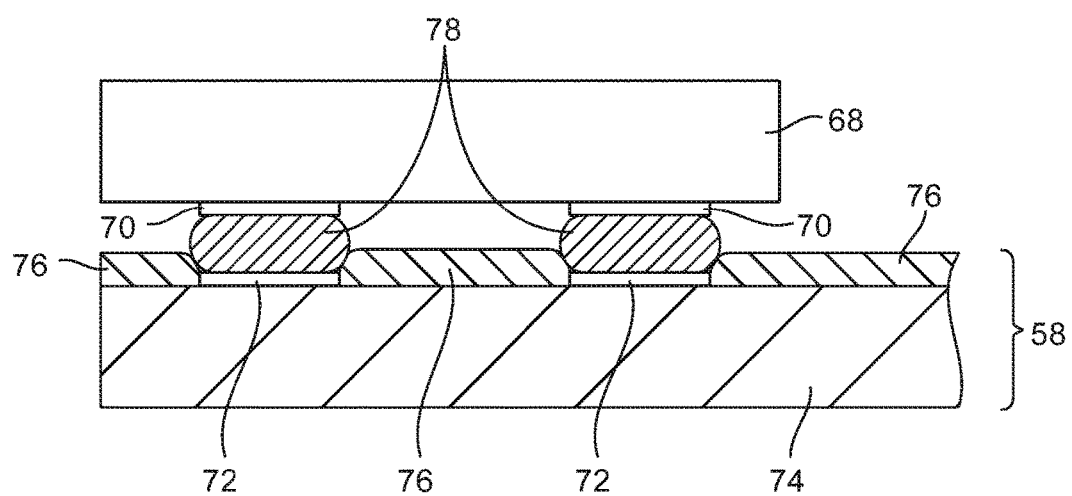
FIG. 8 is a cross-sectional side view of a portion of a flexible printed circuit to which an electrical component has been mounted in accordance with an embodiment.

Electrical components such as illustrative electrical component 68 of FIG. 8 may be attached to flexible printed circuit 58. Components that may be attached to flexible printed circuit 58 in this way include connectors (e.g., all or part of a board-to-board connector, a zero insertion force connector, or other connector), integrated circuits, discrete components such as resistors, capacitors, and inductors, switching circuitry, and other circuitry (see, e.g., circuitry 38 and 32 of FIG. 5). Electrical and physical connections between component 68 and flexible printed circuit 58 may be made using solder, conductive adhesive, welds, or other conductive coupling mechanisms. In the illustrative configuration of FIG. 8, component 68 has metal contacts (solder pads) 70 and flexible printed circuit 58 has corresponding metal contacts (solder pads 72). A patterned dielectric layer such as a layer of polyimide or other polymer (sometimes referred to as a solder mask or cover layer) such as layer 76 may serve as the outermost layer of flexible printed circuit 58 (e.g., layer 76 may be formed on top of other layers in flexible printed circuit 58 such as the metal layer used in forming solder pads 72 and other layers 74 of metal, dielectric, and adhesive). If desired, a dielectric cover layer (e.g., a polyimide cover layer) may be formed on both the upper and lower surfaces of the layers of flexible printed circuit 58 (e.g., in a configuration in which metal traces are formed on upper and lower surfaces of an internal polyimide substrate layer). As shown in FIG. 8, openings in layer 76 may be formed to accommodate solder pads 72 and to help control the lateral spread of solder 70 when using solder 70 to solder component 68 to flexible printed circuit 58.

Figure 9:
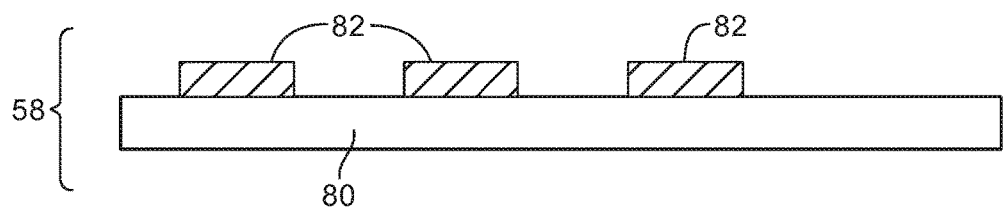
FIG. 9 is a cross-sectional side view of a flexible printed circuit having a single layer of patterned metal traces in accordance with an embodiment.

FIG. 9 shows how flexible printed circuit 58 may have signal paths formed from a patterned metal layer on a dielectric substrate. In the example of FIG. 9, flexible printed circuit 58 has a flexible dielectric substrate such as substrate 80 (e.g., a flexible polyimide layer) that has been covered with a patterned layer of metal traces 82 formed directly on the surface of substrate 80. If desired, additional layers of material (e.g., an adhesive layer, a polymer cover layer, etc.) may be formed on top of the flexible printed circuit 58 of FIG. 9 and/or below substrate 80. The FIG. 9 arrangement is a single-metal-layer flexible printed circuit. Flexible printed circuit configurations with two or more layers of metal may also be used.

Figure 10:
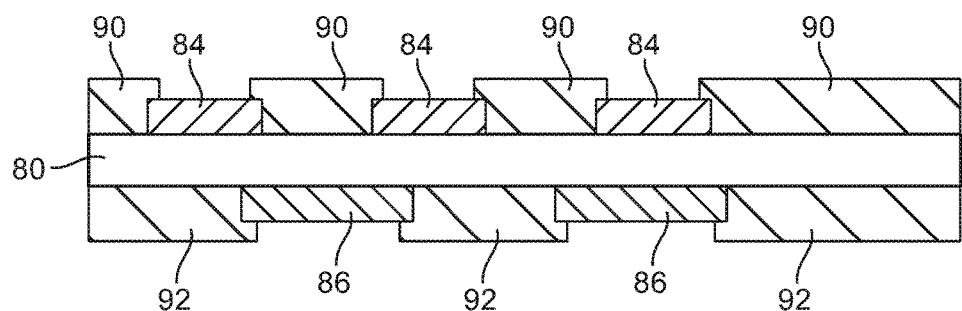
FIG. 10 is a cross-sectional side view of a flexible printed circuit having patterned metal traces formed on opposing upper and lower surfaces of a polymer substrate layer in accordance with an embodiment.

FIG. 10 is a cross-sectional side view of flexible printed circuit 58 in a configuration in which flexible printed circuit 58 has been provided with two layers of patterned metal. As shown in FIG. 10, flexible printed circuit 58 has a polymer substrate such as a polyimide substrate (substrate 80). Substrate 80 has opposing upper and lower surfaces. Metal traces 84 of FIG. 10 are formed directly on the upper surface of substrate 80. Metal traces 86 are formed directly on the lower surface of substrate 80. A polymer cover layer such a layer 90 may be used to cover the upper metal layer used in forming metal traces 84. A polymer cover layer or other dielectric material 92 may be used to cover the lower metal layer used in forming metal traces 86. Openings may be formed in insulating layers such as polymer layers 90 and 92 (e.g., to allow components to be soldered to traces 84 and/or 86). A patterned dielectric layer such as a polymer layer with openings may also be formed over traces 82 of flexible printed circuit 58 of FIG. 9.

The outermost dielectric layers of flexible printed circuit 58 (i.e., the cover layers for flexible printed circuit 58) may be formed from a laminated polymer film (e.g., a polyimide film attached to flexible printed circuit 58 with a layer of adhesive), may be formed from a cured liquid polymer (e.g., photoimageable polymer formed directly on underlying layers without adhesive), or may be formed from other dielectric materials formed directly on underlying metal traces or other structures on the surface of printed circuit 58 and/or attached to underlying metal traces or other structures on the surface of printed circuit 58 using adhesive. Metal traces 82 may be formed directly on the surface of substrate 80 as shown in the examples of FIGS. 9 and 10 or may be laminated to substrate 80 using adhesive. For example, traces 82 in FIG. 9 may be formed by laminating a metal foil layer to substrate 80 with an interposed layer of adhesive). If desired, three or more metal layers may be formed in flexible printed circuit 58, as described in connection with FIG. 7. In configurations for printed circuit 58 that contain multiple metal layers, multiple intervening substrate layers may, if desired, be used to separate metal layers. For example, there may be two or more polyimide substrate layers in printed circuit 58. Adhesive layers, metal layers, substrate layers, and polymer cover layers (sometimes referred to as solder mask layers or coverlay) may be arranged in a stack in a desired pattern to form flexible printed circuit 58. The use of a single-layer design for flexible printed circuit 58 of FIG. 9 and a two-layer design for flexible printed circuit 58 of FIG. 10 is merely illustrative.

Figure 11:
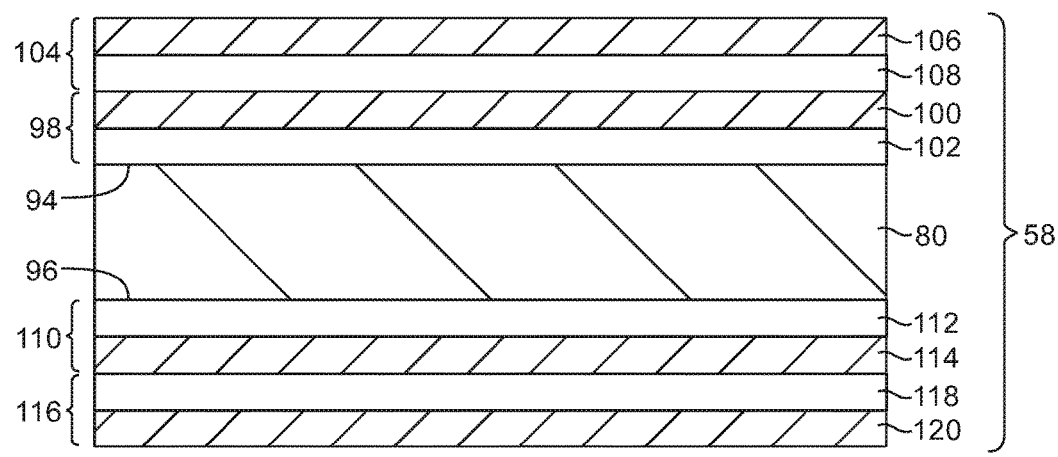
FIG. 11 is a cross-sectional side view of an illustrative flexible printed circuit in accordance with an embodiment.

FIG. 11 is a cross-sectional side view of an illustrative two-layer flexible printed circuit showing how both the upper and lower surfaces of substrate 80 may be covered with layers of material that are attached to substrate 80 using adhesive. As shown in FIG. 11, flexible printed circuit 58 is formed using a substrate layer such as substrate 80 (e.g., a polyimide layer or other suitable layer). Substrate 80 has upper surface 94 and opposing lower surface 96. Layer 98 may be formed on upper surface 94. Layer 98 may include metal layer 100 and adhesive layer 102. Adhesive layer 102 may be used to laminate metal layer 100 to upper surface 94 of substrate 80. Layer 104 may be formed on top of layer 98. Layer 104 may include polymer layer 106 such as a polyimide layer (sometimes referred to as a cover layer, coverlay, or solder mask). Adhesive layer 108 in layer 104 may be used to attach polymer layer 106 to layer 98. The underside of flexible printed circuit substrate 80 may be provided with layers 110 and 116. Layer 110 may include metal layer 114. Adhesive layer 112 in layer 110 may be used to attach metal layer 114 to lower surface 96 of substrate 80. Layer 116 may include dielectric layer 120 (e.g., a polymer cover layer such as a polyimide layer) and adhesive layer 118 for attaching layer 120 to layer 110. Metal layers in flexible printed circuit 58 such as metal layer 114 and metal layer 100 of FIG. 11 may be patterned using photolithography, laser cutting, die cutting (e.g., foil stamping techniques), or other patterning techniques. Dielectric layers 106 and 120 and/or the adhesive layers in flexible printed circuit 58 may also be patterned using these techniques.

Figure 12:
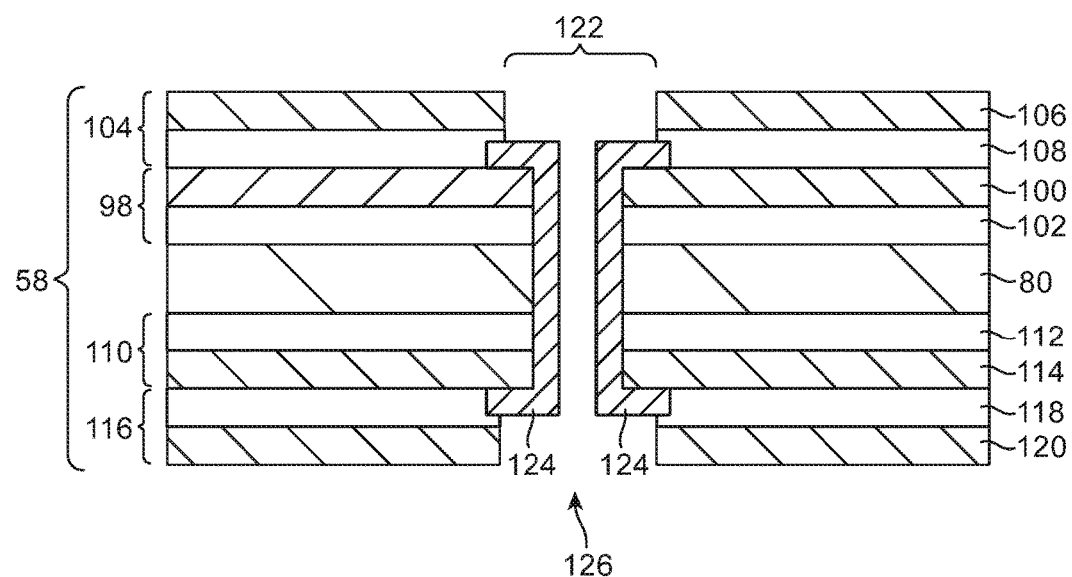
FIG. 12 is a cross-sectional side view of an illustrative conductive via in a flexible printed circuit in accordance with an embodiment.

If desired, through vias, blind vias, and buried vias may be used to interconnect metal traces on different layers of flexible printed circuit 58. Holes or other openings may be formed in flexible printed circuit 58 using laser drilling, stamping, machining, or other hole formation techniques. The holes may be filled with metal using electroplating, electroless deposition, or other metal deposition techniques. Plated holes may form tubular vias that form conductive signal paths between the metal layers of flexible printed circuit 58. As shown in FIG. 12, for example, the layers of flexible printed circuit 58 may be provided with holes such as hole 122. Metal 124 may be deposited on the inner surface of hole 122 using electrochemical deposition (e.g., electroplating and/or electroless deposition), thereby forming via 126. Via 126 can form a signal path between metal layer 100 and metal layer 114. Vias with other configurations (e.g., blind vias and buried vias) can likewise interconnect different metal layers in flexible printed circuit 58.

Figure 13:
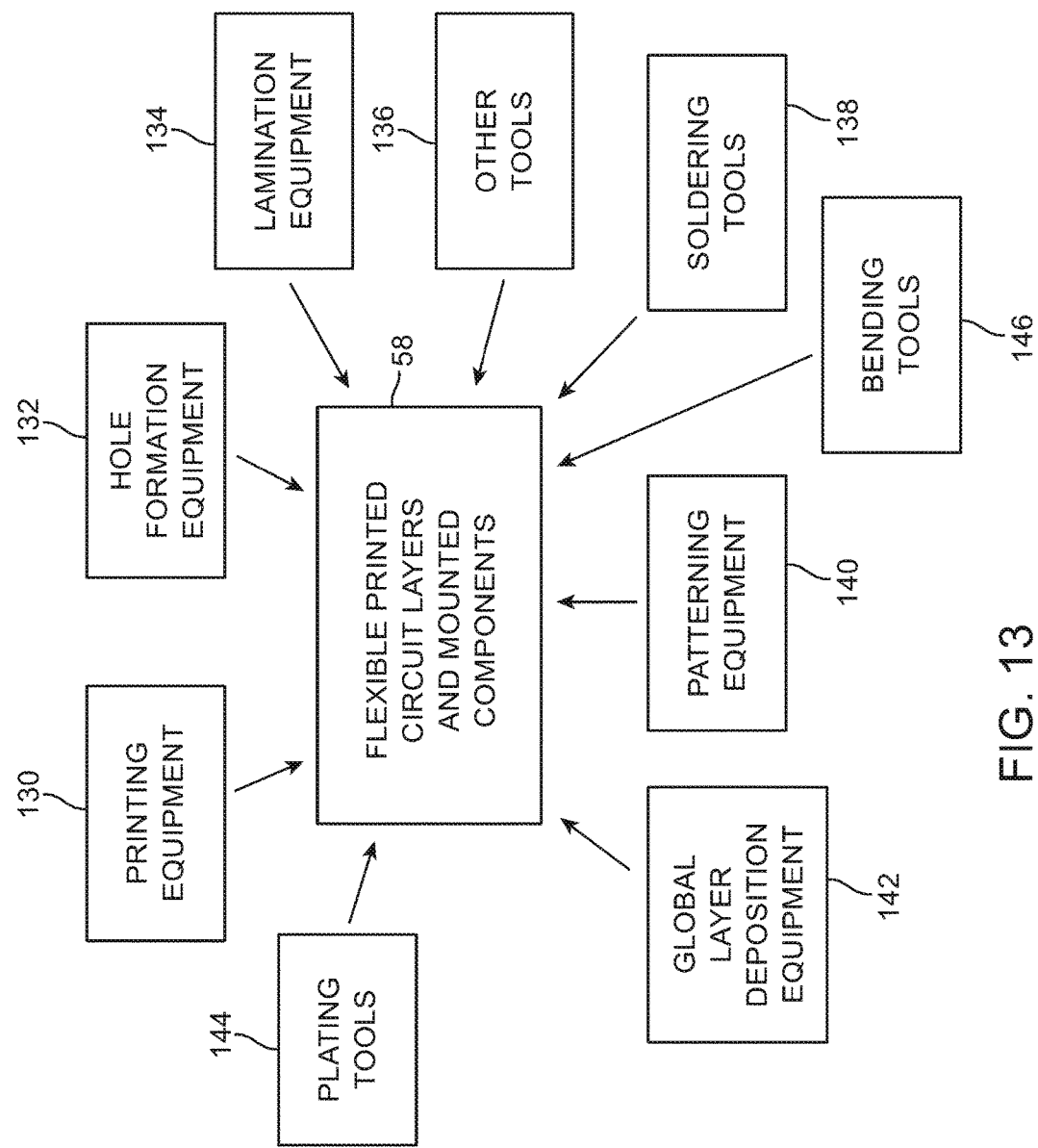
FIG. 13 is a schematic diagram of illustrative equipment that may be used in processing flexible printed circuit structures in accordance with an embodiment.

FIG. 13 is a diagram of illustrative processing equipment that may be used in forming flexible printed circuit 58 and in mounting electrical components to flexible printed circuit 58 or otherwise coupling flexible printed circuit 58 into the circuitry of device 10.

The equipment of FIG. 13 may include printing equipment 130. Printing equipment 130 may include ink-jet printing equipment, pad printing equipment, screen printing equipment, and other equipment for printing blanket layers and/or patterned layers of material. Examples of structures that may be formed using equipment 130 include printed layers of dielectric, strips of dielectric, metal lines (e.g., metal traces formed from metallic paint or other liquid conductive material), blanket layers of metal, etc.

Hole formation equipment 132 may include tools such as laser drilling tools, machining tools, and other equipment for forming openings in one or more layers of material for flexible printed circuit 58. For example, hole formation equipment 132 may use a laser or other tool to drill holes for vias such as via 126 of FIG. 12.

Lamination equipment 134 may include rollers and other equipment for laminating layers of material together (e.g., using heat and pressure to cause adhesive to attach layers of flexible printed circuit 58 together or to otherwise attach layers together).

Global layer deposition equipment 142 may include equipment for depositing layers of material by blanket spray coating, by spinning, by physical vapor deposition (e.g., sputtering), or other deposition techniques.

Patterning equipment 140 may be used to pattern layers of material such as blanket layers of metal and/or dielectric. Equipment 140 may include photolithographic equipment such as equipment for depositing photoresist or other photoimageable materials, equipment for exposing photoresist or other photoimageable materials to patterned light associated with a photomask, developing equipment to use in developing photoresist or other photoimageable materials, etching equipment for etching the structures of flexible printed circuit 58 after deposited photoresist has been patterned by exposure and development, etc.

Electrochemical deposition tools 144 such as tools for electroplating metal in a via, tools for electroless deposition, and other electrochemical deposition equipment may be used in forming flexible printed circuit 58.

One or more of the layers of flexible printed circuit 58 and/or other structures may be bent using bending tools 146. Bending tools 146 may be formed from stand-alone equipment or equipment that is integrated into other equipment of FIG. 13. Examples of bending equipment that may be used in forming bends in flexible printed circuit 58 include mandrels, presses, grippers, and other bending machines.

If desired, other tools 136 may be used in processing the structures of flexible printed circuit 58 such as lasers for cutting, machining tools for trimming or cutting, heated presses, die cutting equipment, injection molding equipment, heating equipment such as infrared lamps and ovens, light-emitting diodes, or other light sources for adhesive curing (e.g., ultraviolet light-emitting diodes), and other equipment for depositing, patterning, processing, and removing layers of dielectric and metal for structures 58.

Soldering tools 138 and other equipment may be used in mounting electrical components to flexible printed circuit 58 and/or may be used in coupling flexible printed circuit 58 to other circuitry in device 10.

Figure 14:
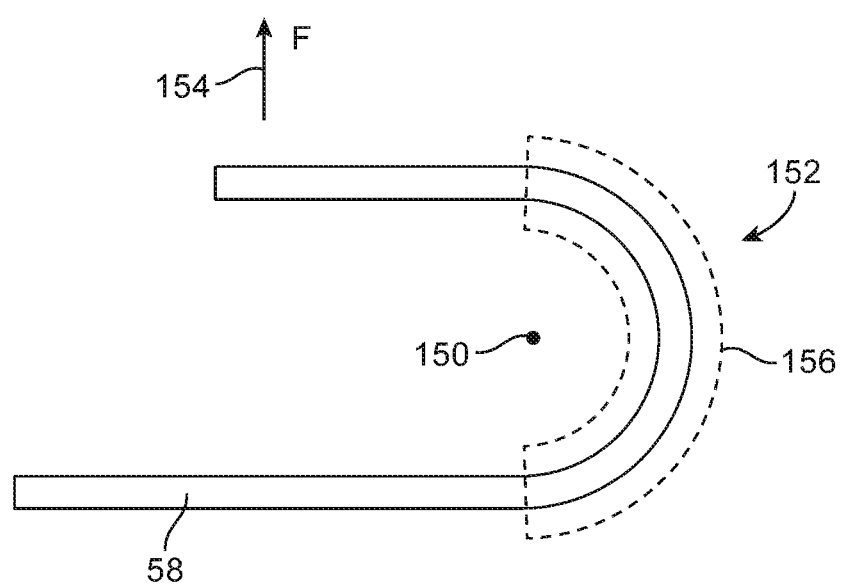
FIG. 14 is a cross-sectional side view of an illustrative flexible printed circuit following bending of the flexible printed circuit about a bend axis in accordance with an embodiment.

Materials such as polyimide are desirable in forming flexible insulating substrates for flexible printed circuit 58. However, when a planar polyimide substrate layer is bent, the polyimide substrate layer will attempt to spring back into its original planar shape. This gives rise to a restoring force. Consider, as an example, flexible printed circuit 58 of FIG. 14, which has been bent around bend axis 150 to form bend 152. In the absence of processing or structures in region 156, flexible printed circuit 58 will exhibit a restoring force (spring force) F in upwards direction 154 due to the presence of bend 152. Force F can be significant due to the relatively high elongation at yield value of polyimide. Force F can tend to press apart structures in device 10, leading to reliability concerns if force F is too great.

To address the concerns raised when force F is more than a negligible amount, flexible printed circuit 58 can be processed in region 156 and/or can be provided with structures in region 156 (and, if desired, elsewhere in printed circuit 58) to overcome force F. In particular, flexible printed circuit 58 can be configured so as to reduce F to zero or to at least reduce F to a fraction of a fraction (e.g., 50% or less, 20% or less, or 10% or less, as examples) of the original restoring force that would have been exhibited without the use of the processing and/or structures in region 156. When provided in this type of configuration, flexible printed circuit 58 is said to be bend-restoring-force compensated or is said to have been provided with a bend retention structure. The bend retention structure may be implemented by incorporating one or more additional layers of material and/or other supplemental structures into flexible printed circuit 58, by processing one or more existing layers of flexible printed circuit 58 to reduce or eliminate restoring force F, or by otherwise configuring flexible printed circuit 58 so that it fully or at least partially retains its desired bent shape. The bend retention structure may be formed as an integral portion of flexible printed circuit 58, so that external structures such as brackets need not be relied on as the sole structures for holding flexible printed circuit 58 in a desired bent shape. The bend retention structure is preferably formed without adding significant bulk to the layers of the flexible printed circuit.

Flexible printed circuit 58 may be provided with one or more bends. Configurations in which flexible printed circuit 58 is provided with a single bend (e.g., a bend of about 90° or 180°) are sometimes described herein as an example. This is, however, merely illustrative. Flexible printed circuit 58 may be provided with two or more bends, may be provided with bends of less than 90°, of 90-180°, of 180°, of more than 180°, or of less than 180°, if desired.

Figure 15:
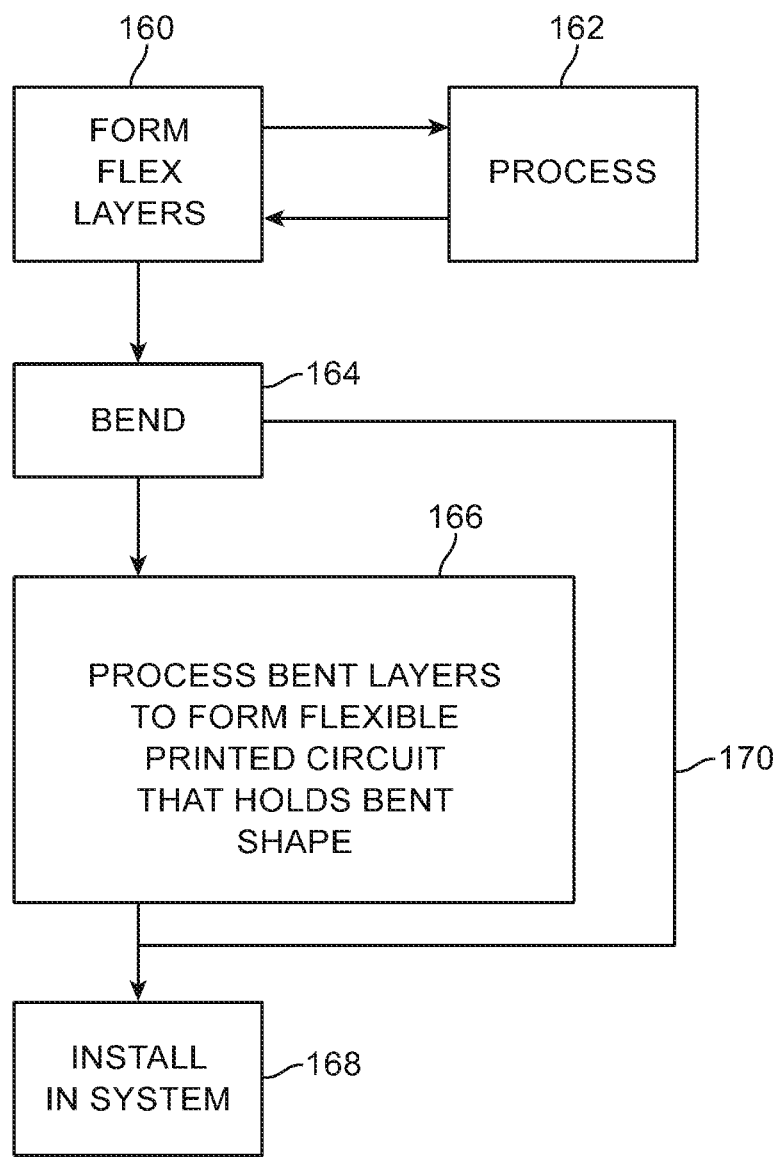
FIG. 15 is a flow chart of illustrative steps involved in forming a flexible printed circuit with a bend and a bend retention structure for use in an electronic device in accordance with an embodiment.

FIG. 15 is a flow chart of illustrative steps involved in forming a flexible printed circuit with a bend retention structure. At step 160, layers 64 (FIG. 7) may be formed (e.g., by creating one or more sheets of polymer such as polyimide substrate layers, polyimide cover layers, adhesive layers, metal layers, etc.). The layers of flexible printed circuit 58 that are formed at step 160 may be attached to each other and/or may have portions that are not attached to each other. Layers 64 may, if desired, be processed at step 162 by adding additional structures such as one or more additional layers of dielectric, adhesive, metal, or other materials and/or by applying light, heat, or other energy to modify the properties of existing layers. Processing operations may also be performed to cut and otherwise pattern layers 64.

At step 164, the flexible printed circuit structures of step 160 may be bent. For example, computer-controlled or manually controlled bending equipment 146 (FIG. 13) may form one or more bends in the layers of flexible printed circuit 58. After bending flexible printed circuit 164, flexible printed circuit 58 may be installed in device 10 at step 168, as shown by line 170. For example, if the processing operations of step 162 and/or the materials selected when forming the flexible printed circuit layers of step 160 are chosen to avoid creating an excessive restoring force F upon bending at step 164 (i.e., if a bend retention structure is formed as an integral portion of flexible printed circuit 58 during the operations of steps 160, 162, and/or 164), the bent version of flexible printed circuit 58 can be installed directly in device 10 without further processing. In some situations, it may be desirable to add additional structures, to apply heat, light, or other energy, or to otherwise process the bent flexible printed circuit so as to ensure that the bent flexible printed circuit holds its desired bent shape (i.e., to complete formation of a bent flexible printed circuit with an integral bend retention structure). These additional processing operations may be performed at step 166. Examples of operations that may be performed at step 166 include adhesive curing, solder reflow operations, coating, etc. After the operations involved in forming a bent flexible printed circuit with a bend retention structure have been completed, flexible printed circuit 58 may be installed in device 10 (step 168).

Figure 16:
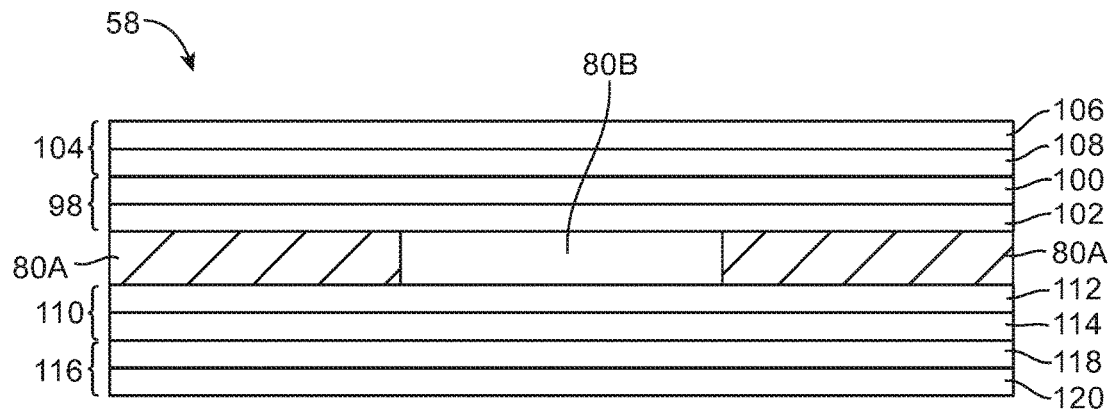
FIG. 16 is a cross-sectional side view of an illustrative flexible printed circuit having a substrate with a flexible region to facilitate bending in accordance with an embodiment.

FIG. 16 is a cross-sectional side view of an illustrative flexible printed circuit that has been provided with a structure that helps retain a bend. As shown in FIG. 16, unbent flexible printed circuit 58 has regions such as end regions in which dielectric substrate 80A is formed from a springy material such as polyimide (i.e., a material with a high elongation at yield value). The dielectric substrate of flexible printed circuit 58 also has a portion such as central portion 80B that is formed from a material with a lower elongation at yield value than the springy polyimide of the end regions. Central portion 80B may be formed by filling an opening in polyimide substrate layer 80A with a material that is softer and less springy than polyimide (e.g., a soft acrylic) or may be formed by processing the central portion of a polyimide layer with heat, light, other energy, chemicals, and/or mechanical operations to locally reduce the springiness of the polyimide. In the example of FIG. 16, flexible printed circuit 58 has a single dielectric substrate layer and upper and lower metal layers 98 and 110 covered with polymer cover layers 104 and 116. If desired, flexible printed circuit 58 may have one or more additional stacked dielectric layers (e.g., layers formed from polyimide 80A and less springy material 80B) and/or may have fewer or more metal layers.

Figure 17:
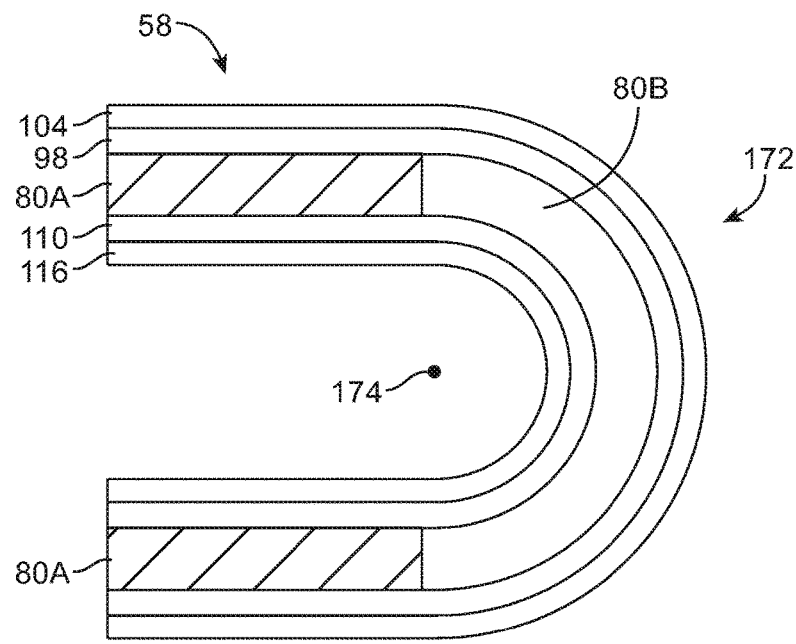
FIG. 17 is a cross-sectional side view of the illustrative flexible printed circuit of FIG. 16 following bending in accordance with an embodiment.

FIG. 17 shows how flexible printed circuit 58 of FIG. 16 may be bent about bend axis 174 to form bend 172. The presence of less springy material 80B in the portion of flexible printed circuit 58 that overlaps bend axis 174 forms a bend retention structure that helps hold flexible printed circuit 58 in its bent shape. If desired, material 80B (i.e., a material or modified polyimide layer that exhibits a springiness less than polyimide) may be extended in size (i.e., some or all of material 80A may be replaced with material 80B). The use of a dielectric substrate that includes both polyimide portion 80A and dielectric portion 80B is merely illustrative.

Figure 18:
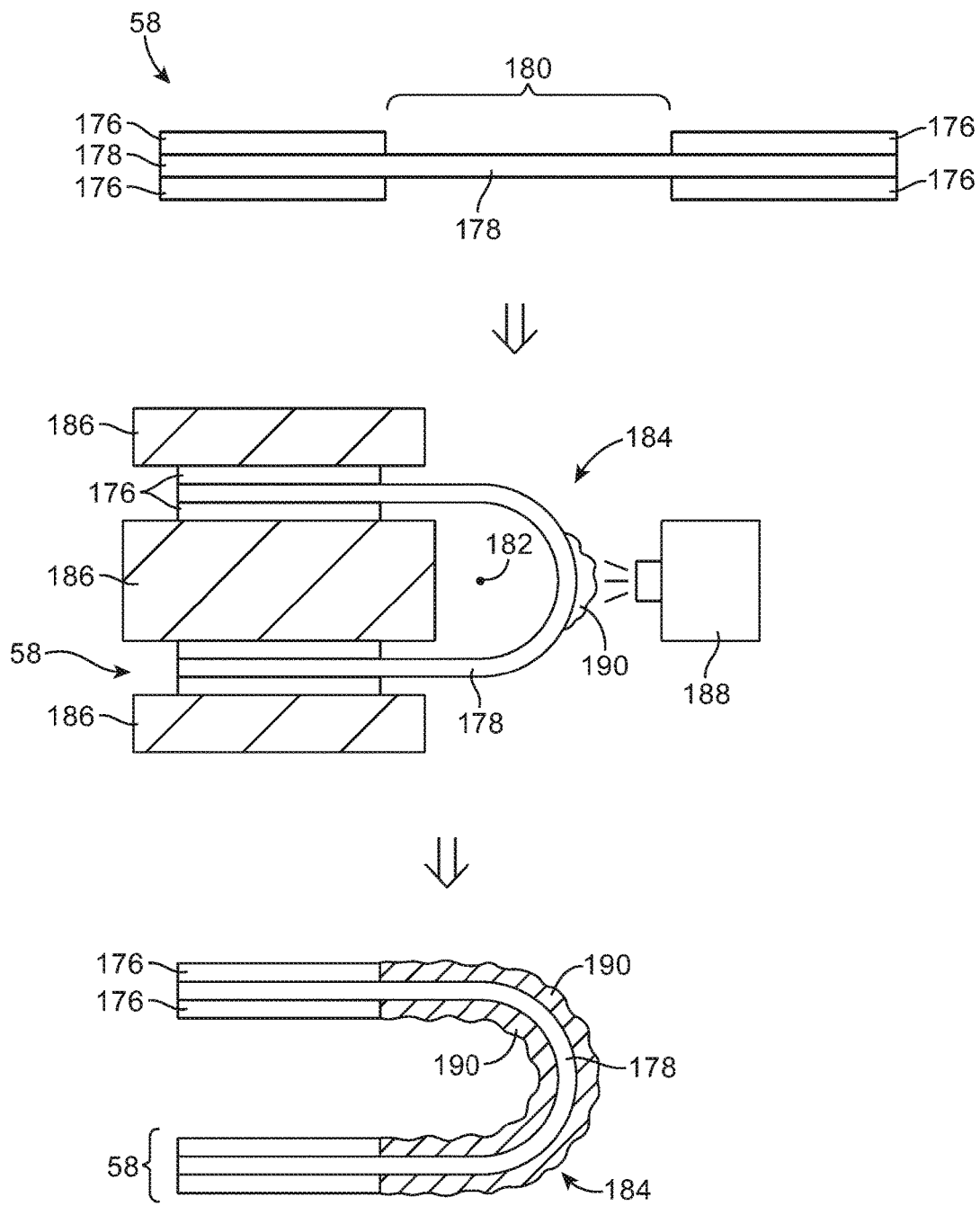
FIG. 18 is a diagram showing how a flexible printed circuit may have exposed metal traces that are coated with a conformal dielectric coating in a bend in accordance with an embodiment.

FIG. 18 shows how flexible printed circuit 58 may be provided with a bend retention structure formed from a conformal coating that is used to coat bare metal traces. As shown in the upper portion of FIG. 18, flexible printed circuit 58 has one or more metal layers such as metal layer 178. Metal layer 178 may be patterned to form one or more signal lines (e.g., lines running across the page in the orientation of FIG. 18). Metal layer 178 may be sandwiched between layers 176. Layers 176 may include a polyimide layer or other dielectric substrate material, outer polymer cover layer(s), layers of adhesive, etc.) In central region 180, an opening is formed in layers 176 (e.g., using etching, by cutting an opening prior in these layers prior to lamination to form flexible printed circuit 58, etc.). After forming the structures of the upper portion of FIG. 18, flexible printed circuit 58 is bent about bend axis 182 using bending tool 186 to form bend 184 in the exposed (uncoated) portion of metal 178. Coating equipment 188 is the used to apply a conformal dielectric coating such as coating 190 to the exposed surfaces of metal 178 (and, if desired, portions of layers 176). Equipment 188 may include spraying equipment, painting equipment, adhesive-dispensing equipment such as a nozzle or needle dispenser, ink jet printing equipment, plastic injection-molding equipment, or other equipment for applying dielectric coating 190 to exposed metal layer 178. After the metal traces of layer 178 have been covered with dielectric, bending tool 186 may be removed. The presence of coating 190, which is stiff, stiffens the bent portion of flexible printed circuit 58 and helps hold flexible printed circuit 58 in its bent shape (i.e., conformal coating 190 serves as an integral bend retention structure for flexible printed circuit 58). Conformal coating 190 may be formed on both sides of the metal traces in layer 178 or may be formed on only the inner or outer surface of layer 178 in exposed region 180.

Figure 19:
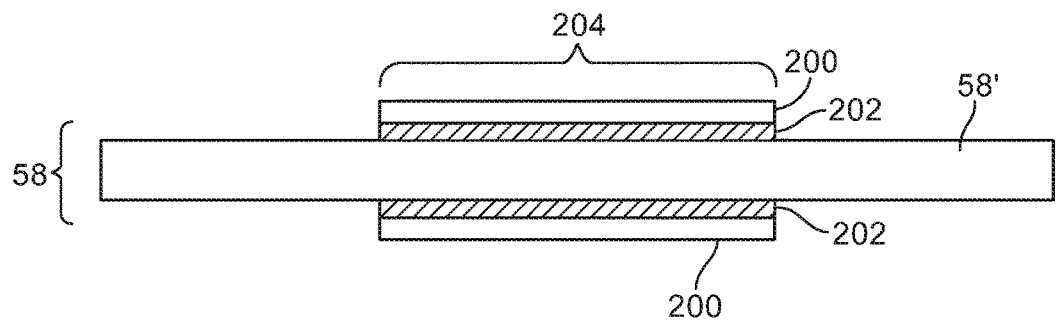
FIG. 19 is a cross-sectional side view of an illustrative flexible printed circuit to which stiffener structures have been used to help hold the flexible printed circuit in a bent configuration in accordance with an embodiment.

FIG. 19 shows how layers of material such as layers 200 may be attached to flexible printed circuit 58' using attachment layers 202 to form a flexible printed circuit with an integral bend retention structure (i.e., flexible printed circuit 58). Layers 200 may, if desired, be stiff thin members that serve as stiffening layers. Stiffening layers 200 may, once attached to the flexible printed circuit layers of flexible printed circuit portion 58', help retain the flexible printed circuit layers in a bent configuration to retain a desired flexible printed circuit bend. The thickness of layers 200 and the thicknesses of the other bend retention structures may be comparable to the thickness of flexible printed circuit layers 58' (i.e., the bend retention structure is preferably thinner than the other layers in flexible printed circuit 58 or at least does not add appreciable bulk to flexible printed circuit 58).

Layers 200 and 202 may be formed in the portion of flexible printed circuit 58 in which it is desired to form a bend (i.e., in region 204 of FIG. 19). Layers 200 may be formed from metal (e.g., metal strips such as strips of brass, steel, stainless steel, nickel, other metals, etc.), plastic (e.g., a sheet of polymer), or other material. Attachment layer 202 may be formed from solder, adhesive, or other materials.

Figure 20:
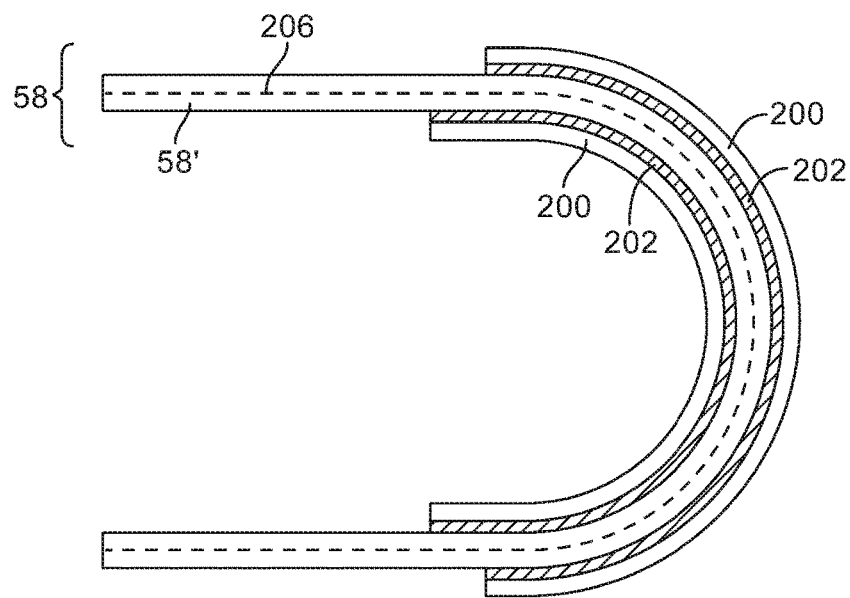
FIG. 20 is a cross-sectional side view of the illustrative flexible printed circuit of FIG. 19 following bending of the flexible printed circuit in accordance with an embodiment.

Following bending, flexible printed circuit 58 may be processed in region 204 (e.g., by application of light, heat, pressure, etc.). The processing that is performed in region 204 may reflow any solder that is present so that metal layers 200 may be soldered to exposed metal traces in the layers of flexible printed circuit 58', may cure any adhesive that is present to attach structures 200 to the layers of flexible printed circuit 58', or may otherwise complete the attachment of layers 200 to flexible printed circuit 58. As shown in FIG. 20, this forms a bend retention structure for flexible printed circuit 58 that may hold flexible printed circuit 58 in its bent configuration. Flexible printed circuit 58 may include metal traces in metal layer 206. The thicknesses of layers 200 and 202 on the upper and lower surfaces of flexible printed circuit 58 may be selected to ensure that bent metal layer 206 in the bend of flexible printed circuit 58 lies in the neutral stress plane of flexible printed circuit 58.

Figure 21:
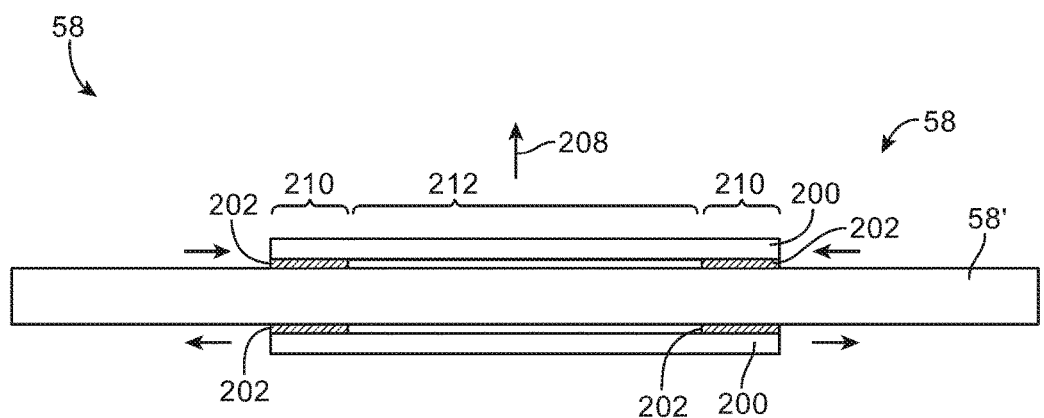
FIG. 21 is a cross-sectional side view of an illustrative flexible printed circuit and associated structures for helping the flexible printed circuit to hold a bend in accordance with an embodiment.
Figure 22:
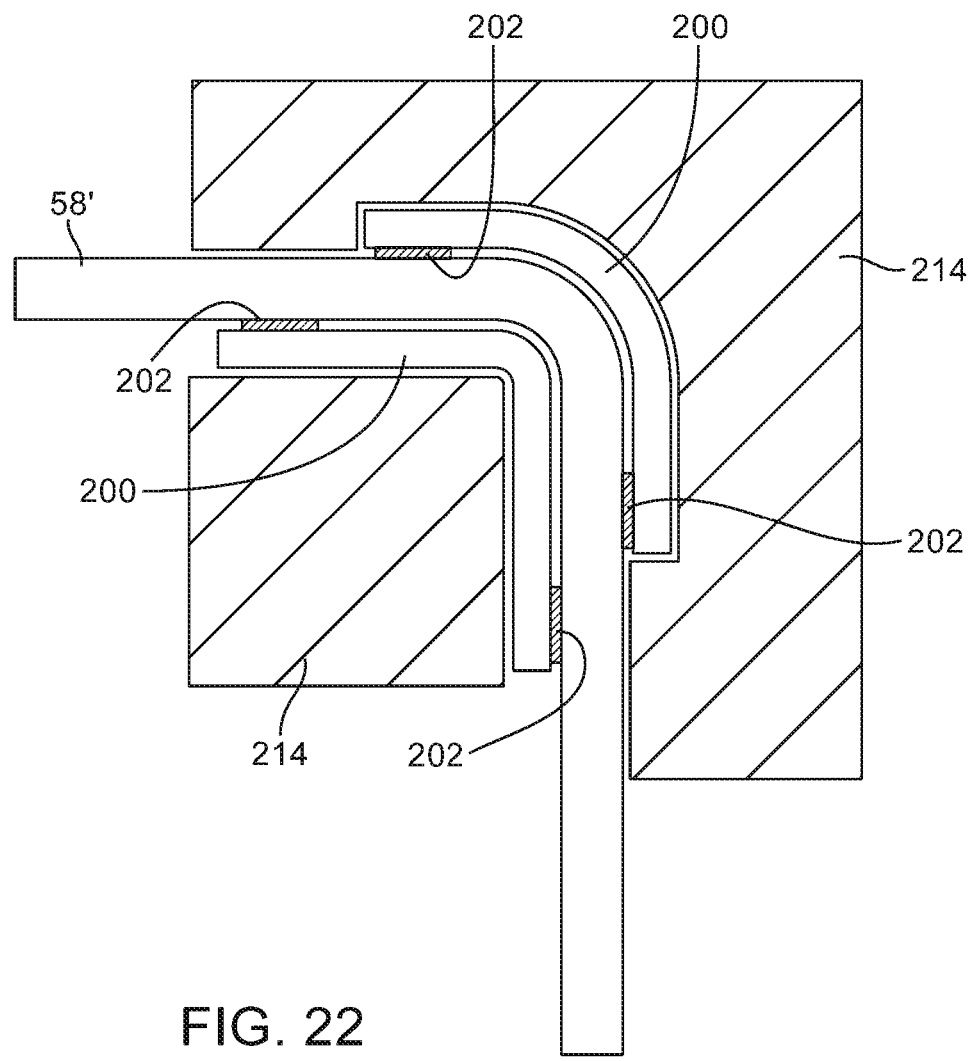
FIG. 22 is a cross-sectional side view of the structures of FIG. 21 during bending operations in accordance with an embodiment.
Figure 23:
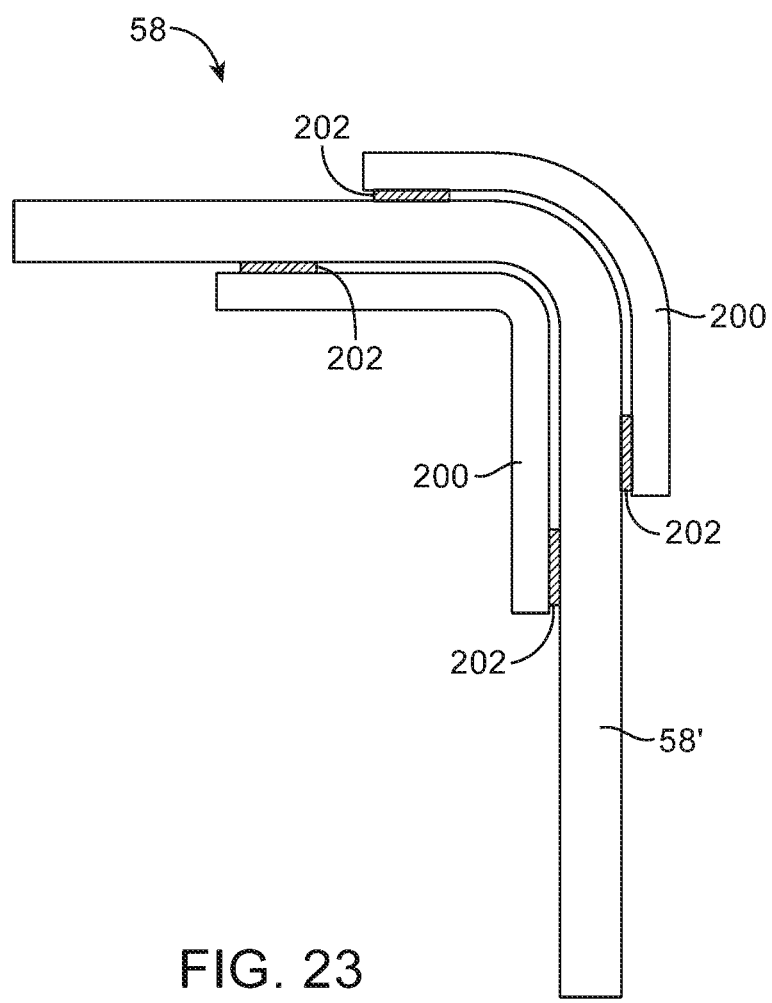
FIG. 23 is a cross-sectional side view of the structures of FIG. 22 showing how an integral bend retention structure maintains a bend in a flexible printed circuit in accordance with an embodiment.

In the illustrative configuration of FIG. 21, attachment layer 202 has been restricted to ends 210 of layers 200 and has been omitted from central portion 212 of layers 202. This type of arrangement may help accommodate movement of layers 200 relative to the surfaces of flexible printed circuit 58' during bending (i.e., to allow the ends of upper layer 200 to move inwardly relative to the upper surface of flexible printed circuit 58' when flexible printed circuit 58' is bent upward in direction 208 and to allow the ends of lower layer 200 to move outwardly relative to the lower surface of flexible printed circuit 58' at the same time). FIG. 22 shows how heated press 214 or other equipment may be used in bending flexible printed circuit 58'. While in the bent configuration, heat from an oven or heat from heated press 214 may cause layers 202 at the opposing ends of layers 200 to attach layers 200 to flexible printed circuit 58' (i.e., the heat may reflowing solder in layer 202 or may cure adhesive in layer 202). After removing equipment 214, layers 200 will form a bend retention structure that allows flexible printed circuit 58 to retain its bent shape (e.g., a configuration with a 90° bend in the example of FIG. 23).

Figure 24:
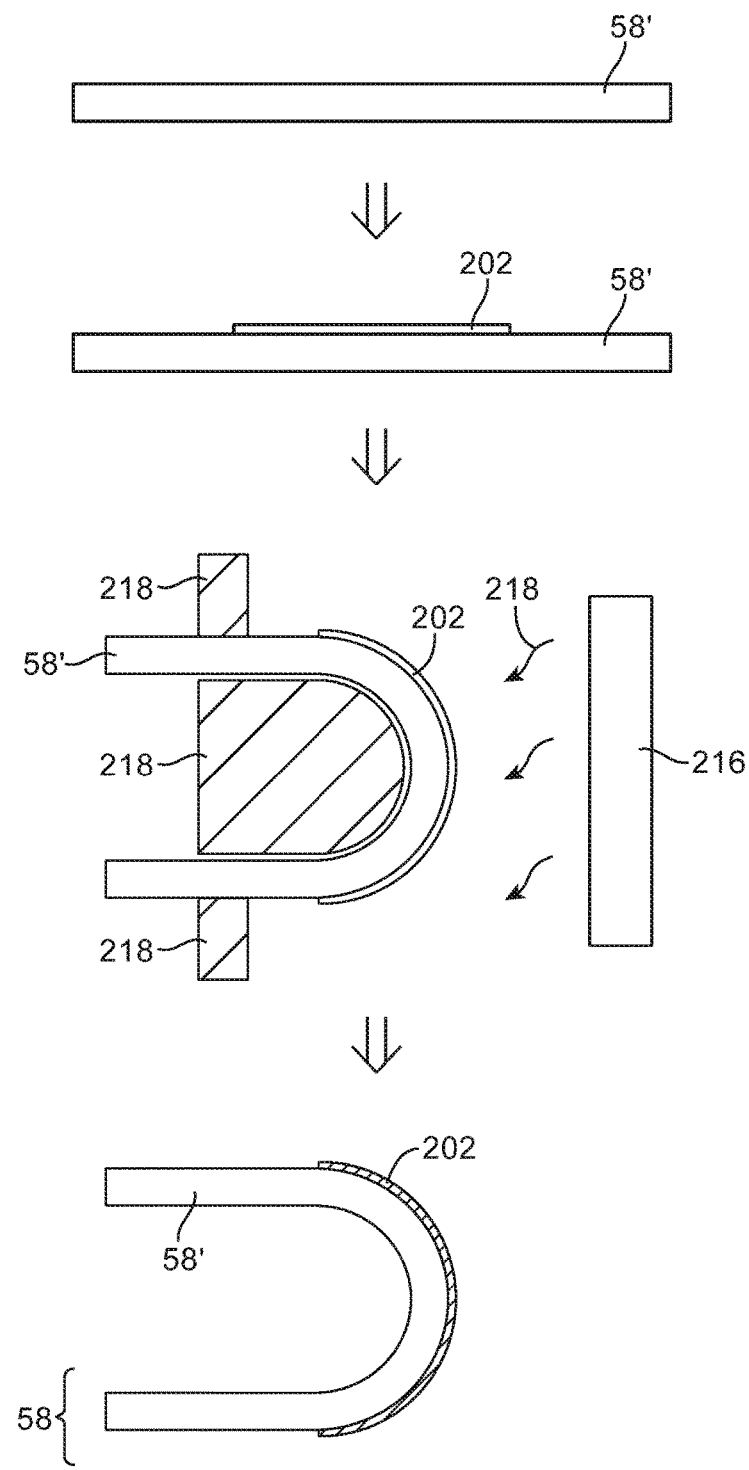
FIG. 24 is a diagram showing how a flexible printed circuit may be coated with a layer of material and processed to help the flexible printed circuit hold a bend in accordance with an embodiment.

FIG. 24 shows how layers such as layer 202 may be placed directly on the layers of flexible printed circuit 58 to form a bend retention structure without requiring the use of additional stiffening layers 200. Layer 202 may be formed from a thermoset polymer (e.g., a liquid adhesive such as epoxy), a thermoplastic polymer, solder paste, or other suitable material that is stiffened during processing to form a stiffening layer structure. Initially, flexible printed circuit 58' is free of material 202, as shown in the uppermost portion of FIG. 24. Layer 202 may then be applied using equipment of the type shown in FIG. 13 (e.g., printing equipment 130, equipment 140 and/or 142, etc.). For example, liquid adhesive may be screen printed onto the surface of flexible printed circuit 58' or solder paste may be screen printed onto the surface of flexible printed circuit 58'. Equipment 218 may then be used to bend flexible printed circuit 58' and layer 202. Once flexible printed circuit 58' has been bent, equipment 216 may apply energy 218 to layer 202 to stiffen layer 202. Energy 218 may be heat to reflow solder paste and thereby form a solid layer of rigid solder, may be heat to cure thermally cured adhesive, may be ultraviolet light or other light to cure light-cured adhesive, or may be other energy. After layer 202 has been stiffened (e.g., by reflowing solder, by converting liquid adhesive into a rigid layer of cured adhesive, etc.), layer 202 will serve as a stiffening layer in a bend retention structure for flexible printed circuit 58 that holds flexible printed circuit 58 in its bent configuration, as shown at the bottom of FIG. 24.

Figure 25:
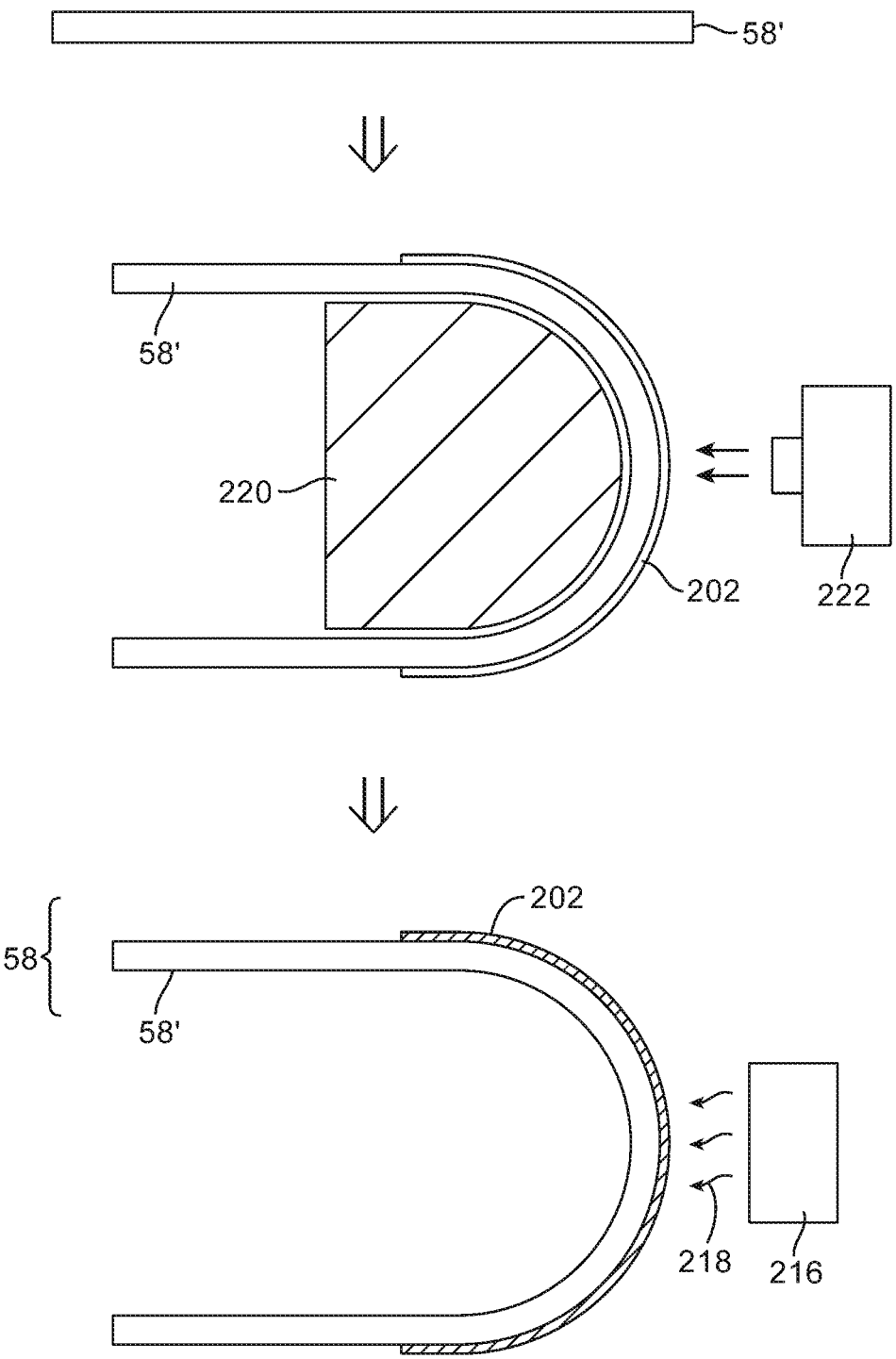
FIG. 25 is a diagram showing how a flexible printed circuit may be coated with a material following bending to help the flexible printed circuit hold a bend in accordance with an embodiment.

In the illustrative arrangement of FIG. 25, flexible printed circuit 58' is bent using bending equipment 220. While bent, coating equipment 222 applies layer 202. While flexible printed circuit 58' is bent, equipment 216 may apply energy 218 to stiffen layer 202 as described in connection with FIG. 24 (e.g., to cure adhesive, to reflow solder paste to form a stiff layer of solder, etc.). This creates a rigid structure from layer 202 that serves as an integral bend retention structure for flexible printed circuit 58.

Figure 26:
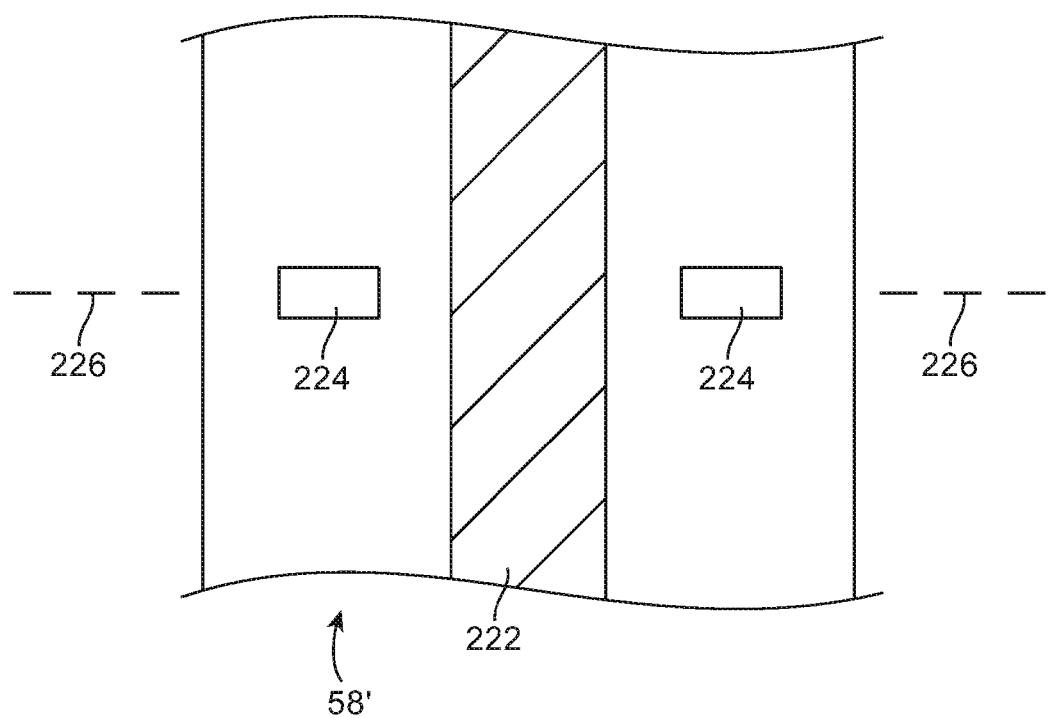
FIG. 26 is a top view of a flexible printed circuit structure and associated structures for forming a wrinkle in a layer of material to be placed on top of the flexible printed circuit structure in accordance with an embodiment.
Figure 27:
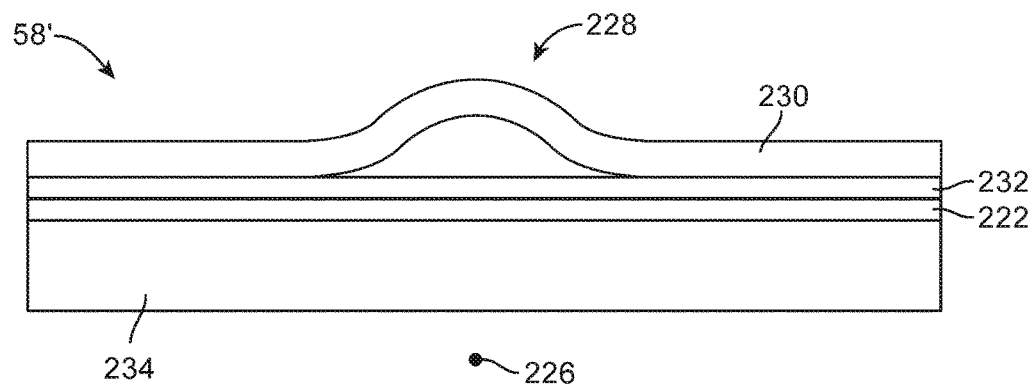
FIG. 27 is a cross-sectional side view of an illustrative flexible printed circuit with a wrinkled upper layer prior to bending the flexible printed circuit in accordance with an embodiment.
Figure 28:
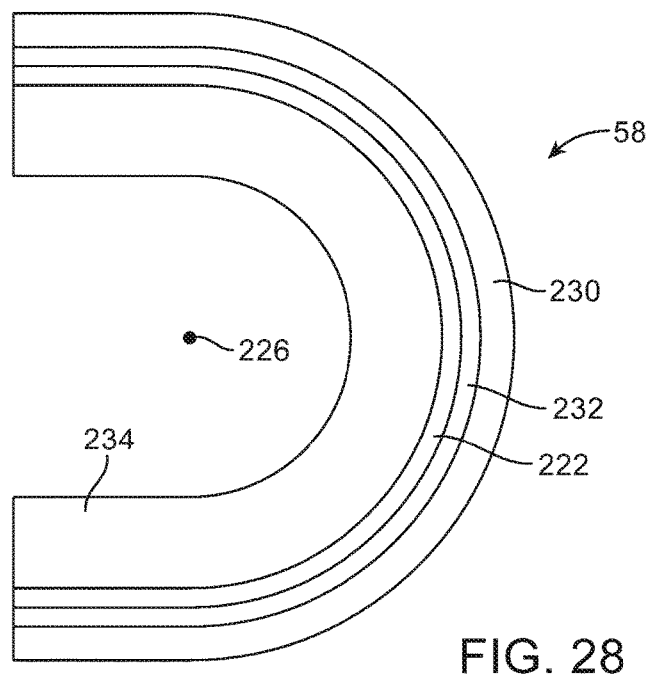
FIG. 28 is a cross-sectional side view of the flexible printed circuit of FIG. 27 following bending to flatten the wrinkle and form a bend retention structure by attaching the flattened wrinkle to flexible printed circuit layers using adhesive in accordance with an embodiment.

If desired, a layer of polymer (e.g., a cover layer or other polymer layer) may be provided with a wrinkle overlapping a location where flexible printed circuit 58' is to be bent. As shown in the top view of FIG. 26, for example, flexible printed circuit 58' may include metal trace 222. Structures 224 (e.g., plastic members or other supports) may be placed on the surface of the substrate layer on which trace 222 is formed. Structures 224 may be placed on opposing sides of trace 222 along future bend axis 226. A layer of polymer 230 (e.g., a cover layer or an additional polyimide substrate layer in a multilayer flexible printed circuit) may then be placed on top of the structures of FIG. 26, forming wrinkle 228 in polymer layer 230, as shown in FIG. 27. Adhesive layer 232 may be used to attach polymer layer 230 to trace 222 and other flexible printed circuit layers 234 (e.g., a polyimide substrate layer, optional additional adhesive and metal layers, a lower coverlay, etc.). Upon bending of flexible printed circuit 58', wrinkled (buckled) portion 228 of layer 230 flattens out to form a flattened wrinkle that is attached by adhesive layer 232 to underlying layers such as metal layer 232 and other layers 222, thereby forming an integral bend retention structure for flexible printed circuit 58, as shown in FIG. 28.

Figure 29:
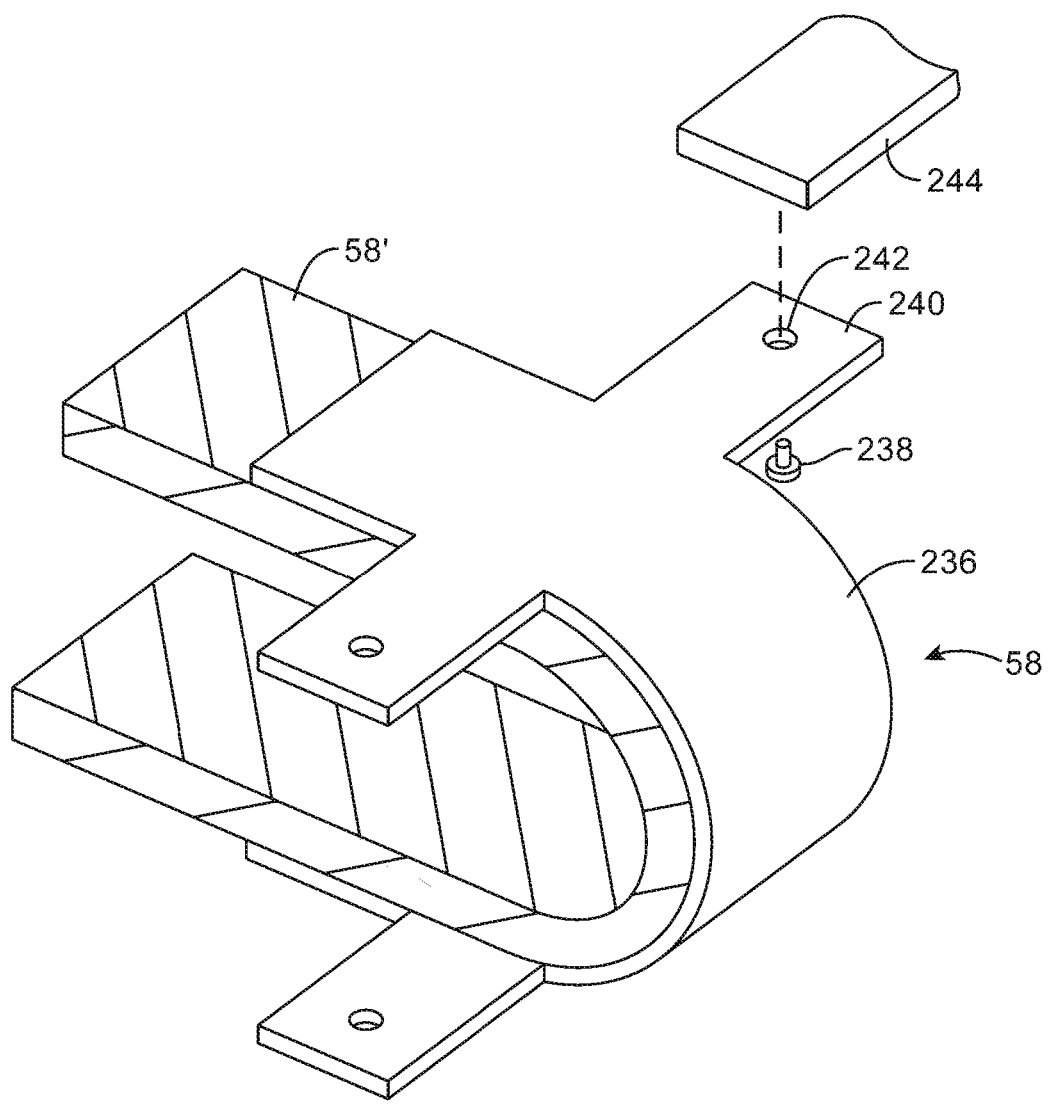
FIG. 29 is a perspective view of an illustrative bend retention structure for a flexible printed circuit in accordance with an embodiment.

In the illustrative example of FIG. 29, bend retention structure 236 in flexible printed circuit 58 has been provided with attachment features such as protrusions 240 with holes 242. Bend retention structure 236 may be formed from plastic, metal, or other materials and may be attached to the surface of flexible printed circuit portion 58' of flexible printed circuit 58 using adhesive, using lamination under heat and pressure without adhesive, using soldering, or using other attachment mechanisms. Holes 242 allow bent flexible printed circuit 58 to be attached to structures in device 10 such as structure 244 using fasteners such screw 238. Structure 244 may be a portion of housing 12 or other support structure in device 10. If desired, adhesive may be used in attaching protrusions 240 or other portions of structure 236 to housing structures.

If desired, structures 236 or other bend retention structures such as bend retention structures 200 may be formed from a shape memory alloy that relaxes into a bent shape upon heating. The shape memory alloy may serve as a stiffening layer and may be attached to flexible printed circuit layers 58' using adhesive 202. After attaching the shape memory alloy (e.g., in a planar configuration), the shape memory alloy may be heated using an oven or heated with a lamp or other heating equipment, thereby causing the shape memory alloy to move into its bent configuration in which the shape memory alloy serves as an integral bend retention structure for flexible printed circuit 58.

The foregoing is merely illustrative and various modifications can be made by those skilled in the art without departing from the scope and spirit of the described embodiments. The foregoing embodiments may be implemented individually or in any combination.

What is claimed is:

1. A flexible printed circuit having a bend, comprising:
    flexible printed circuit layers including metal traces; and
    a bend retention structure that is attached to the flexible printed circuit layers at the bend and that retains the flexible printed circuit layers in a bent configuration to maintain the bend, wherein the bend retention structure includes a polymer layer with a flattened wrinkle that is attached to the flexible printed circuit layers with a layer of adhesive.

2. An electronic device, comprising:
    a display;
    a printed circuit; and
    a flexible printed circuit with a bend, wherein the flexible printed circuit is coupled between the display and the printed circuit and wherein the flexible printed circuit includes a bend retention structure that maintains the bend, the flexible printed circuit includes a polyimide substrate layer, and the flexible printed circuit includes an opening in the polyimide substrate layer that is filled with a polymer that has a lower elongation at yield value than the polyimide substrate layer.

3. The electronic device defined in claim 2 wherein the flexible printed circuit includes metal traces on the polyimide substrate layer and the bend retention structure comprises a layer of cured adhesive on an outer surface of the flexible printed circuit.

* * * * *